US009257503B2

(12) United States Patent
Weber

(10) Patent No.: US 9,257,503 B2
(45) Date of Patent: Feb. 9, 2016

(54) SUPERJUNCTION SEMICONDUCTOR DEVICE AND METHOD FOR PRODUCING THEREOF

(71) Applicant: Infineon Technologies Austria AG, Villach (AT)

(72) Inventor: Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 71 days.

(21) Appl. No.: 14/060,698

(22) Filed: Oct. 23, 2013

(65) Prior Publication Data

US 2015/0108620 A1    Apr. 23, 2015

(51) Int. Cl.
*H01L 21/465* (2006.01)
*H01L 29/06* (2006.01)
*H01L 29/10* (2006.01)
*H01L 21/306* (2006.01)
*H01L 29/36* (2006.01)
*H01L 29/861* (2006.01)
*H01L 29/872* (2006.01)
*H01L 29/16* (2006.01)
*H01L 29/20* (2006.01)

(52) U.S. Cl.
CPC .......... *H01L 29/0634* (2013.01); *H01L 21/306* (2013.01); *H01L 21/465* (2013.01); *H01L 29/1095* (2013.01); *H01L 29/36* (2013.01); *H01L 29/8611* (2013.01); *H01L 29/872* (2013.01); *H01L 29/1608* (2013.01); *H01L 29/2003* (2013.01)

(58) Field of Classification Search
CPC .................................................... H01L 21/479
See application file for complete search history.

(56) References Cited

U.S. PATENT DOCUMENTS

| 5,940,691 A * | 8/1999 | Manning ........................ 438/151 |
| 6,184,555 B1 | 2/2001 | Tihanyi et al. |
| 6,511,915 B2 * | 1/2003 | Mlcak ............................ 438/695 |
| 6,630,698 B1 | 10/2003 | Deboy et al. |

(Continued)

FOREIGN PATENT DOCUMENTS

| DE | 19840032 C1 | 11/1999 |
| DE | 10132136 C1 | 2/2003 |

(Continued)

OTHER PUBLICATIONS

Deboy et al, "A New Generation of High Voltage MOSFETs Breaks the Limit Line of Silicon," IEEE, 1998, pp. 683-685.

(Continued)

*Primary Examiner* — Stephen W Smoot
(74) *Attorney, Agent, or Firm* — Murphy, Bilak & Homiller, PLLC

(57) ABSTRACT

A method of forming a superjunction device includes forming at least one trench in a first surface of a first semiconductor layer of a first doping type, and a semiconductor mesa region adjoining the at least one trench. A second semiconductor layer is formed at least on sidewalls and a bottom of the at least one trench. The second semiconductor layer is etched by filling the at least one trench with an etchant, and applying a voltage between the first semiconductor layer and the etchant such that a space charge region expands in the second semiconductor layer and in the first semiconductor layer. The voltage is adjusted such that there is a first region in the semiconductor mesa region that is free of the space charge region when the voltage is applied.

20 Claims, 19 Drawing Sheets

(56) References Cited

U.S. PATENT DOCUMENTS

| | | | |
|---|---|---|---|
| 6,633,064 | B2 | 10/2003 | Auerbach et al. |
| 6,667,514 | B2 | 12/2003 | Ahlers et al. |
| 6,960,798 | B2 | 11/2005 | Deboy et al. |
| 8,421,196 | B2 | 4/2013 | Weber et al. |
| 8,828,781 | B1 * | 9/2014 | Roizin et al. .................. 438/80 |
| 2003/0209750 | A1 | 11/2003 | Deboy et al. |
| 2011/0121437 | A1 * | 5/2011 | Weber et al. .................. 257/655 |

FOREIGN PATENT DOCUMENTS

| | | |
|---|---|---|
| DE | 10024480 B4 | 2/2006 |
| DE | 102010060782 A1 | 6/2011 |
| EP | 0973203 A2 | 1/2000 |

OTHER PUBLICATIONS

Lapadatu et al, "A Model for the Etch Stop Location on Reverse Biased pn Junctions," IEEE, 1997, pp. 715-716, vol. 1.

Zengerle, "Microsystems Engineering: Technologies and Processes," University Freiburg, chapter 8 Bulk Micromachining.

Weber, "Super Junction Semiconductor Device and Manufacturing Method," U.S. Appl. No. 13/955,894, filed Jul. 31, 2013.

* cited by examiner

SUPERJUNCTION SEMICONDUCTOR DEVICE AND METHOD FOR PRODUCING THEREOF

TECHNICAL FIELD

Embodiments of the present invention relate to a superjunction semiconductor device and a method for producing a superjunction semiconductor device.

BACKGROUND

A superjunction semiconductor device, such as a superjunction MOSFET, includes a plurality of transistor cells each including a drift region of a first doping type, and a compensation region of a second doping type complementary to the first doping type. The compensation region adjoins the drift region so that there is a pn junction between the drift region and the compensation region. This pn junction is substantially perpendicular to a current flow direction of the semiconductor device. In a MOSFET, another pn junction is formed between the drift region and a body region, and the compensation region is usually coupled to the body region. When the pn junction between the body region and the drift region is reverse biased, which is when the MOSFET is in an off-state, the pn junction between the drift region and the compensation region is also reverse biased. Thus, an electric field in the drift region has substantially two components, namely a first component resulting from the voltage that reverse biases the pn junction between the body region and the drift region, and a second component resulting from the voltage that reverse biases the pn junction between the compensation region and the drift region.

The compensation region has a first end facing away from the pn junction between the body region and the drift region. In order to increase a dynamic robustness it is desirable to design the drift region and the compensation region such that a maximum electric field occurs in the drift region at a position between the first end of the compensation region and the pn junction between the body region and the drift region. For example, this position can be adjusted through an adapted vertical resolved doping profile of the compensation region.

A conventional process for producing a drift region and an adjoining compensation region includes producing a layer stack with a plurality of epitaxially grown layers of a first doping type, wherein dopant atoms of a second doping type are introduced into each of these layers at positions that are located one above the other in the layer stack. After these layers have been produced, an annealing process causes the implanted dopant atoms to diffuse in the individual layers, thereby forming pile shaped compensation regions of the second doping type in the layer stack. Those regions of the epitaxial layers that keep the basic doping of the first doping type form the drift region. In this process, a doping concentration of the compensation region can be adjusted through a dopant dose that is introduced into the individual epitaxial layers. A fine adjustment of the doping concentration is, in particular, possible when thin epitaxial layers are produced. However, this increases the number of epitaxial layers to be produced. Further, in a device where a plurality of transistor cells are formed, the diffusion of the dopants into the epitaxial layers makes it difficult to reduce a distance (often referred to as "pitch") between neighboring transistor cells without taking the risk that the compensation regions of two neighboring cells eliminate the drift region between them.

SUMMARY

A first embodiment relates to a method of forming a superjunction device. The method includes forming at least one trench in a first surface of a first semiconductor layer of a first doping type, and a semiconductor mesa region adjoining the at least one trench, forming a second semiconductor layer at least on sidewalls and a bottom of the at least one trench, and etching the second semiconductor layer. Etching the second semiconductor layer includes filling the at least one trench with an etchant, and applying a voltage between the first semiconductor layer and the etchant such that a space charge region expands in the second semiconductor layer and in the first semiconductor layer, wherein the voltage is adjusted such that there is a first region in the semiconductor mesa region that is free of the space charge region when the voltage is applied.

A second embodiment relates to a superjunction semiconductor device. The semiconductor device includes a drift region of a first doping type, at least one compensation region of a second doping type complementary to the first doping type, and a current flow direction. A width of the at least one compensation region varies over a length of the at least one compensation region, wherein the width is the dimension of the at least one compensation region in a direction perpendicular to the current flow direction, and the length is the dimension of the at least one compensation region in the current flow direction.

A third embodiment relates to a method of forming a superjunction device. The method includes forming at least one trench in a first surface of a first semiconductor layer of a first doping type, and a semiconductor mesa region adjoining the at least one trench in the first semiconductor layer, wherein the semiconductor mesa region has a doping maximum at a first position between the first surface and a position corresponding to a position of a bottom of the at least one trench, forming a second semiconductor layer at least on sidewalls and a bottom of the at least one trench, and etching the second semiconductor layer. Etching the second semiconductor layer includes filling the at least one trench with an etchant, and applying a voltage between the first semiconductor layer and the etchant such that a space charge region expands in the second semiconductor layer and in the first semiconductor layer, wherein the voltage is adjusted such that the space charge region completely covers the semiconductor mesa region.

A fourth embodiment relates to a superjunction semiconductor device. The semiconductor device includes a drift region of a first doping type, at least one compensation region of a second doping type complementary to the first doping type, and a current flow direction. A width of the at least one compensation region has a maximum at a first position in the current flow direction, wherein the width is the dimension of the at least one compensation region in a direction perpendicular to the current flow direction.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIGS. 1A-1E illustrate one embodiment of a method for producing a compensation region and a drift region of a superjunction semiconductor device, such as a superjunction MOSFET, a superjunction bipolar diode, or a superjunction Schottky diode. FIGS. 1A-1E show vertical cross-sectional views of a semiconductor body 100 during individual method steps of the method. The semiconductor body 100 includes a first surface 101. FIGS. 1A-1E show the semiconductor body 100 in a vertical section plane that is perpendicular to the first surface 101.

Figure 1A:
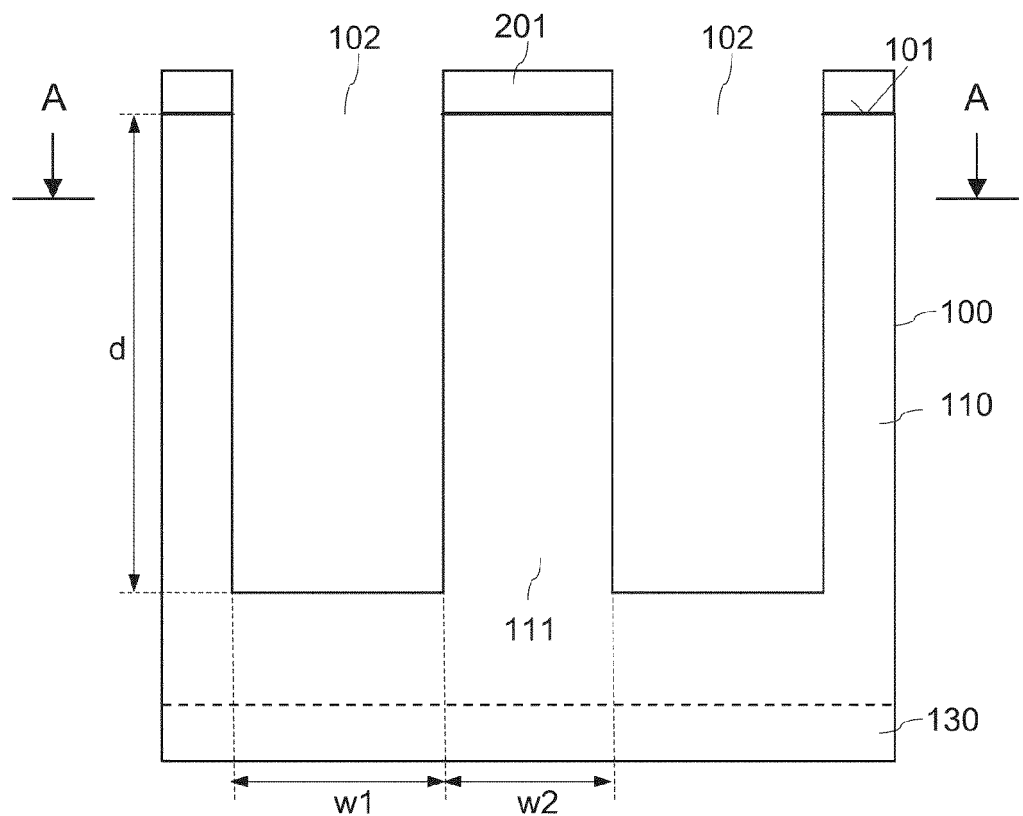
FIGS. 1A-1E illustrate one embodiment of a method for producing a second semiconductor layer in at least one trench of a first semiconductor layer.

The semiconductor body 100 may include a conventional semiconductor material, such as silicon (Si), silicon carbide (SiC), gallium arsenide (GaAs), gallium nitride (GaN), or the like. Referring to FIG. 1A, the semiconductor body 100 includes a first semiconductor layer 110. According to one embodiment, the semiconductor body 100 only includes the first semiconductor layer 110.

According to a further embodiment (shown in dashed lines in FIG. 1A), the semiconductor body 100 includes the first semiconductor layer 110, and a further semiconductor layer 130, wherein the first semiconductor layer 110 adjoins the further semiconductor layer 130, and defines the first surface 101 of the semiconductor body 100. The first semiconductor layer 110, and the further semiconductor layer 130 can be different in at least one of a doping concentration, a doping type (n-type or p-type), or the semiconductor material. According to one embodiment, the further semiconductor layer 130 is a semiconductor substrate, and the first semiconductor layer 110 is an epitaxial layer that was epitaxially grown on the further semiconductor layer 130.

Referring to FIG. 1A, the method includes forming at least one trench 102 in the first surface 101 of the first semiconductor layer 110, and forming a semiconductor mesa region 111 in the first semiconductor layer 110. The semiconductor mesa region 111 adjoins a sidewall of the at least one trench 102 and is obtained by forming the at least one trench 102 in the first surface 101 of the first semiconductor layer 110. In the embodiment shown in FIG. 1A, the semiconductor mesa region 111 is a section of the first semiconductor layer 110 that is located between two spaced-apart trenches or trench sections, respectively.

In the horizontal plane A-A (that is perpendicular to the vertical section plane) illustrated in FIG. 1A, several different shapes of the trench 102 are possible. Three embodiments are explained with reference to FIGS. 3-5 below.

Figure 2A:
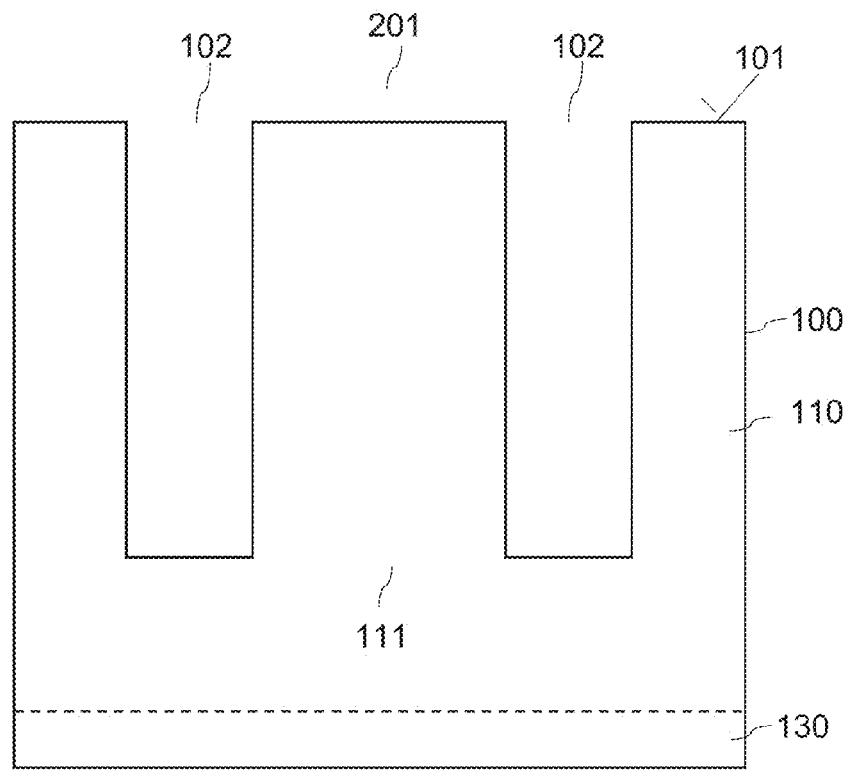
FIGS. 2A-2I illustrate a further embodiment of a method for producing a second semiconductor layer in at least one trench of a first semiconductor layer.
Figure 2B:
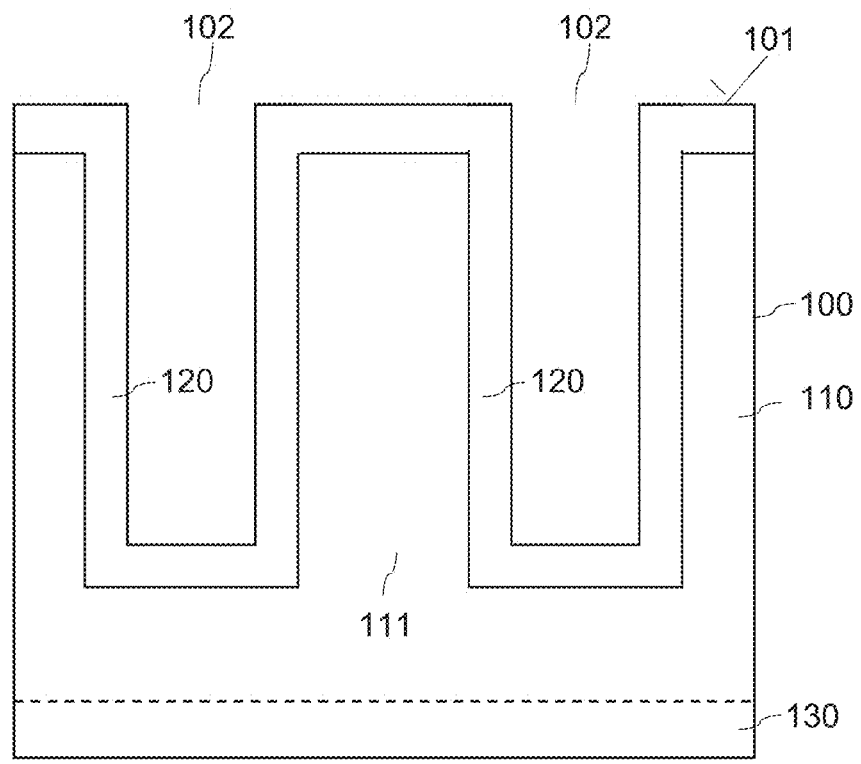
Figure 2C:
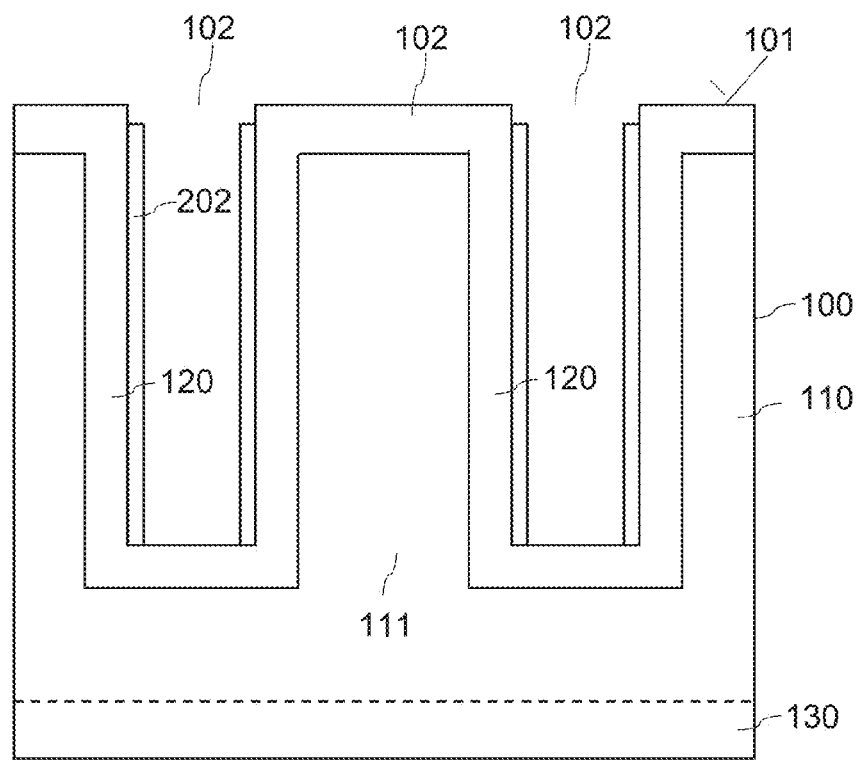
Figure 2D:
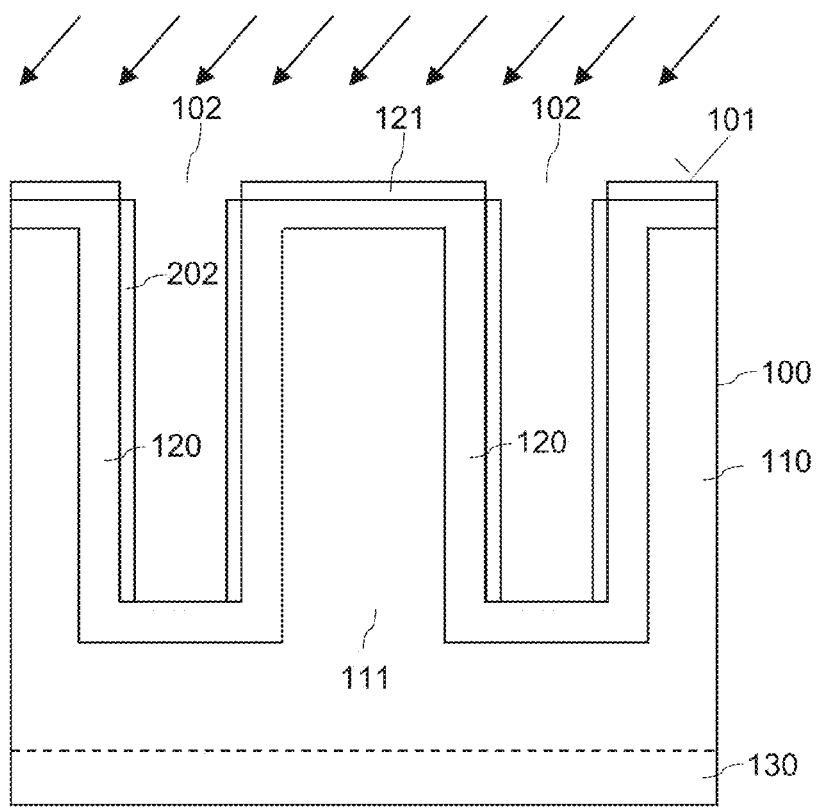
Figure 2E:
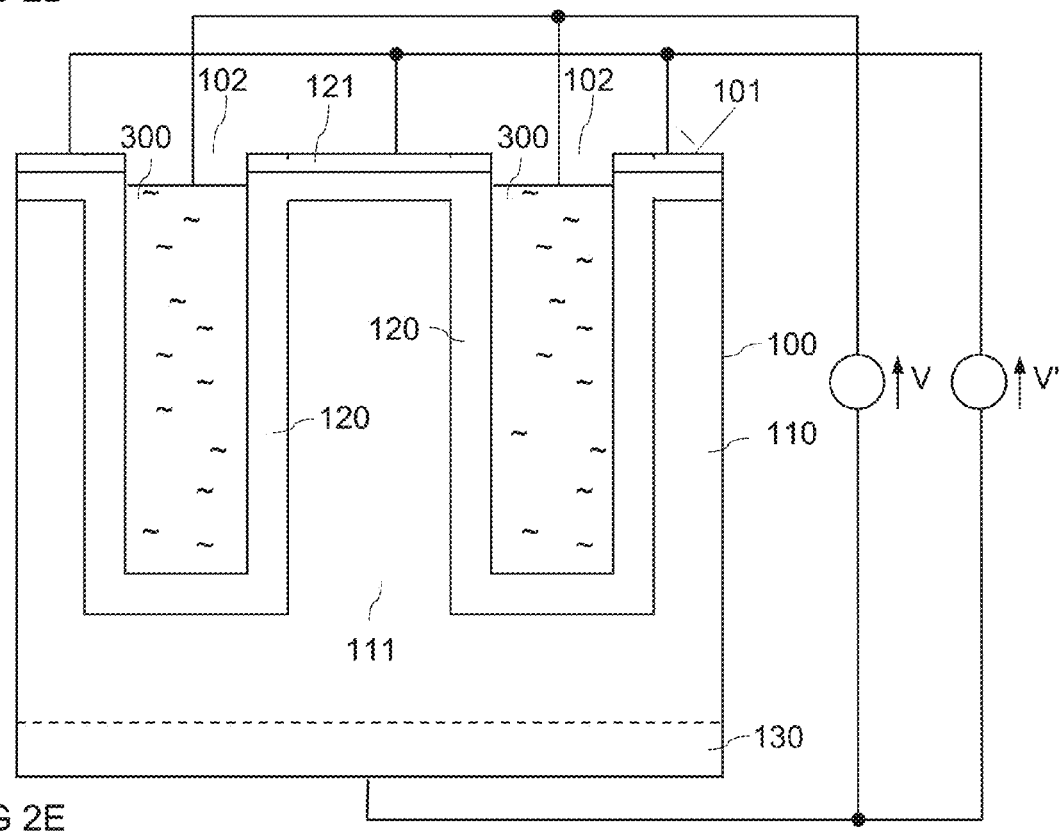
Figure 2F:
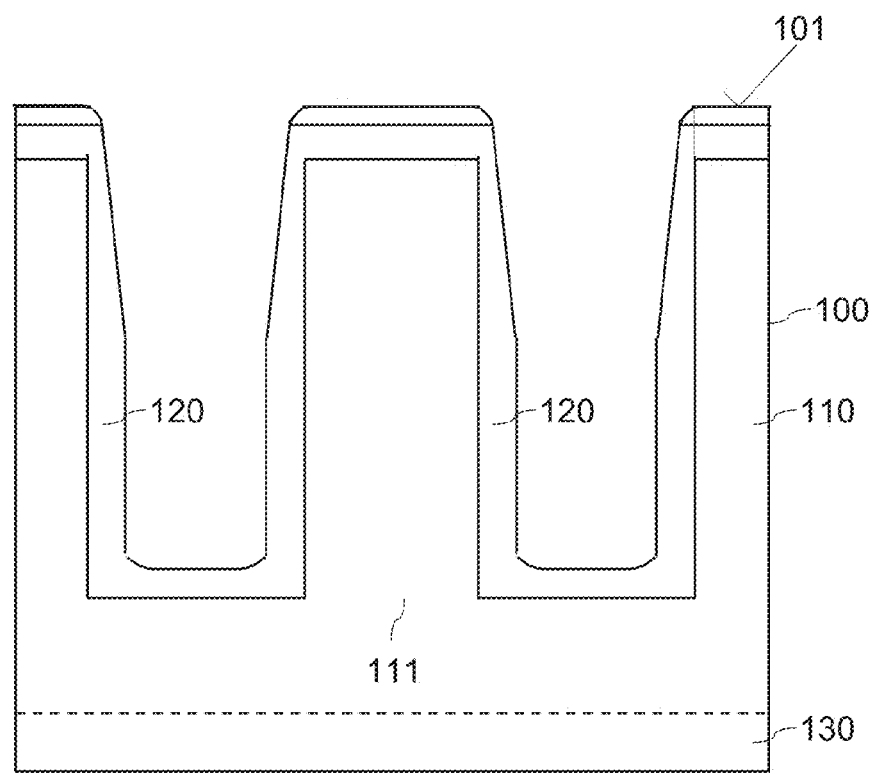
Figure 2G:
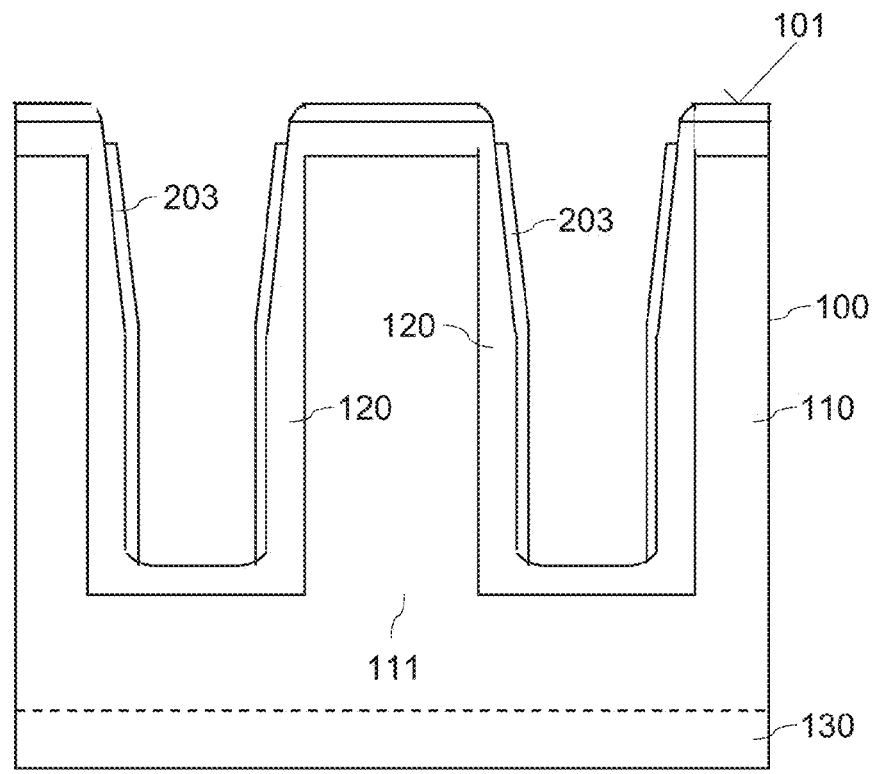
Figure 2H:
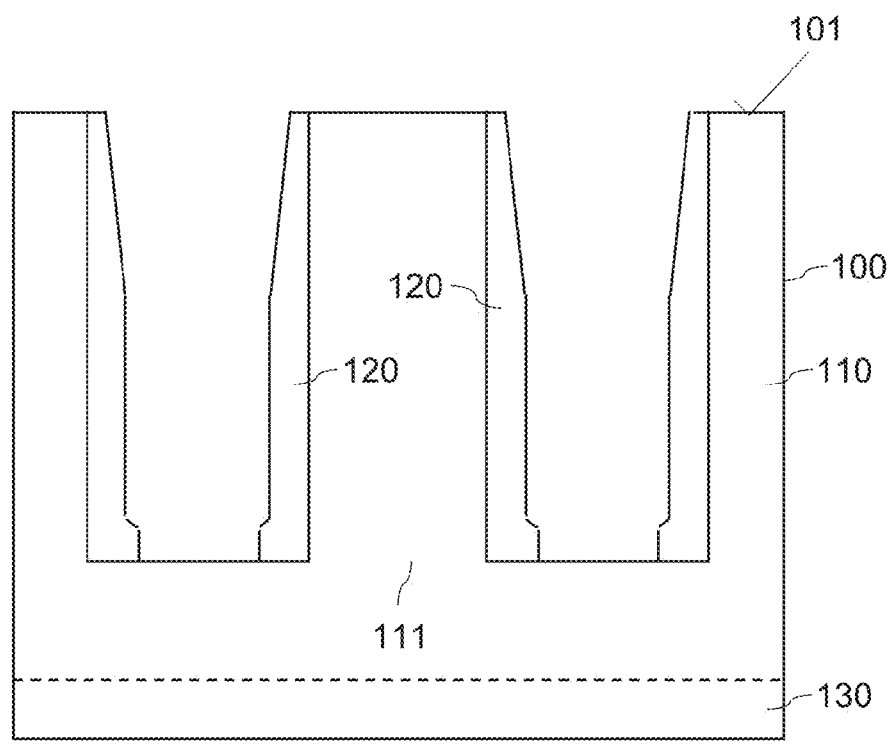
Figure 2I:
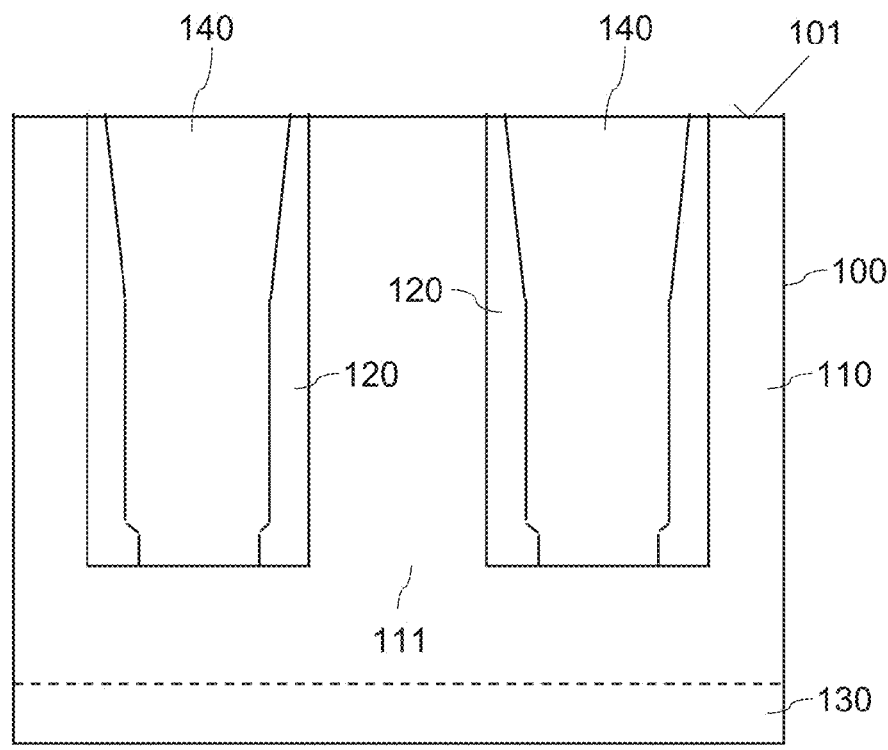
Figure 3:
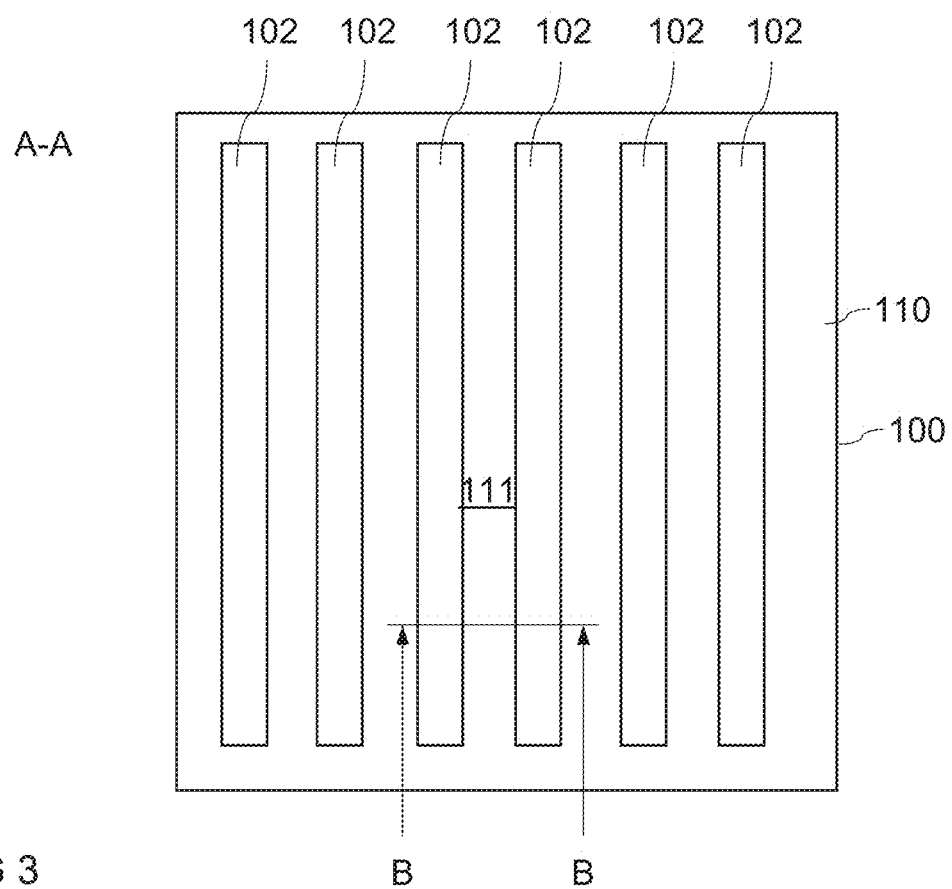
FIG. 3 shows a horizontal cross-sectional view of the first semiconductor layer according to one embodiment.

FIG. 3 shows a horizontal cross-sectional view of the first semiconductor layer 110 in a section plane A-A shown in FIG. 1A. In this embodiment, at least two elongated trenches 102 are formed, so that the mesa region 111 is a region of the first semiconductor layer 110 between these two elongated trenches 102. Referring to FIG. 2, a plurality of elongated trenches 102 can be formed. In this case, each pair of two neighboring elongated trenches 102 defines a semiconductor mesa region 111 between them.

Figure 4:
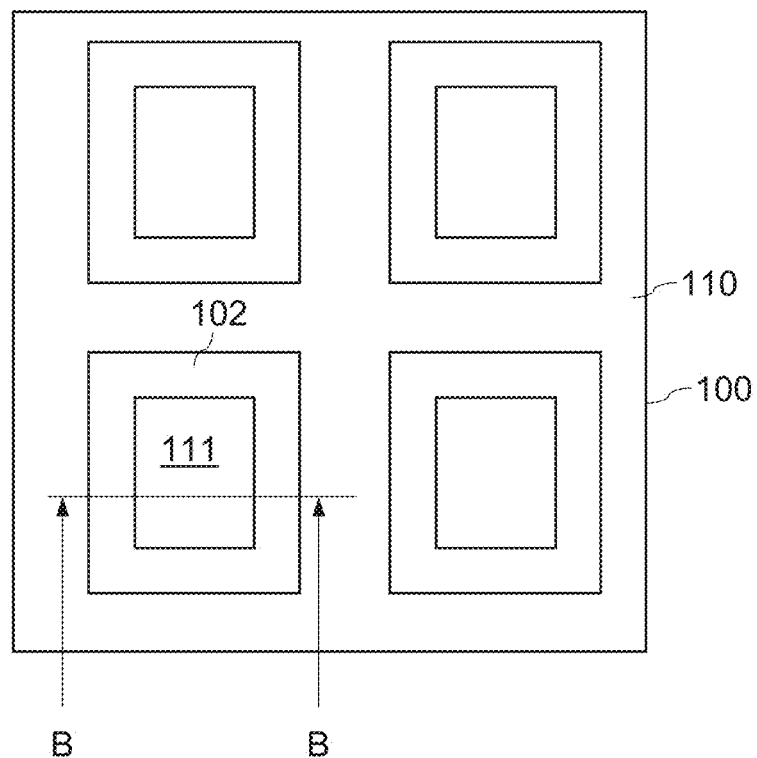
FIG. 4 shows a horizontal cross-sectional view of the first semiconductor layer according to another embodiment.

According to another embodiment, shown in FIG. 4, at least one trench 102 is formed that, in the horizontal section plane A-A, is ring-shaped. In this case, the semiconductor mesa region 111 is a section of the first semiconductor layer 110 that is surrounded by the ring-shaped trench 102. Referring to FIG. 3, the trench 102 may have the form of a rectangular ring. However, another type of ring, such as an elliptical ring, or a polygonal ring is possible as well.

Figure 5:
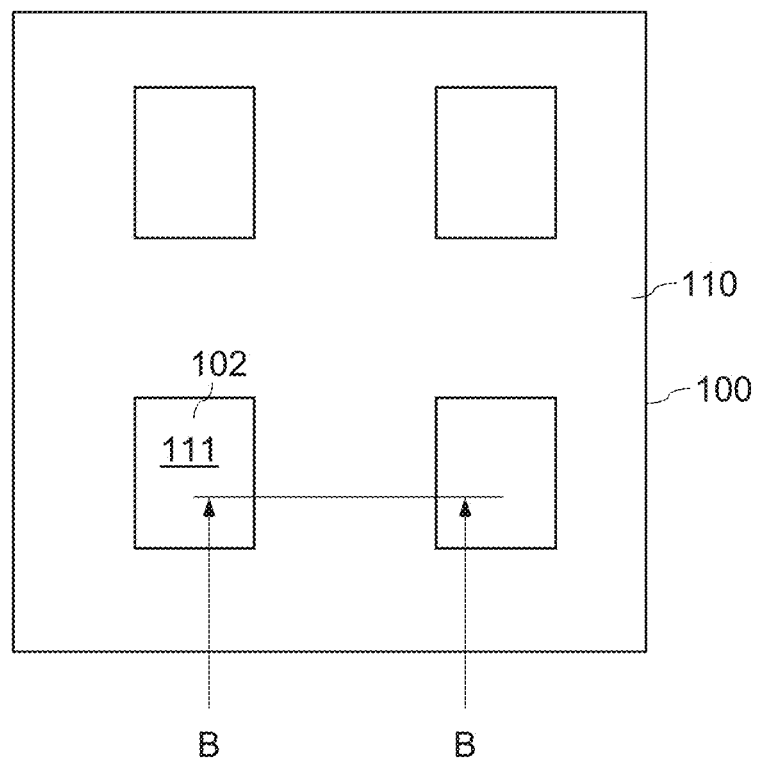
FIG. 5 shows a horizontal cross-sectional view of the first semiconductor layer according to yet another embodiment.

According to a further embodiment shown in FIG. 5, the at least one trench 102 is formed to have a pile shape (needle shape). The at least one trench 102 may have a rectangular cross section in the horizontal plane (as illustrated). However, a different cross sections, such as an elliptical, circular, polygonal, in particular hexagonal, cross section is possible as well.

According to yet another embodiment (not shown), the semiconductor mesa region 111 is a semiconductor region between the at least one trench 102 and a vertical insulation layer spaced-apart in a horizontal direction from the at least one trench 102. In this case, a vertical cross sectional view would be similar to the one shown in FIG. 1A, with the difference that one of the trenches (trench sections) shown in FIG. 1A is replaced with a vertical insulation layer.

Referring to FIG. 1A, forming the at least one trench 102 may include a conventional etching process, in particular an anisotropic etching process, using an etch mask 201 formed above the first surface 101. A width w1 of the at least one trench 102 is, for example, between 200 nanometers (nm) and 10 micrometers (μm), in particular between 3 μm and 4 μm. A depth d of the at least one trench 102 is, for example, between 5 micrometers (μm) and 300 micrometers (μm), in particular between 30 μm and 50 μm. A width w2 of the semiconductor mesa region 111, which is a distance between the two neighboring trenches or trench sections 102, is, for example, between 200 nanometers (nm) and 10 micrometers (μm), in particular between 3 μm and 4 μm.

Figure 1B:
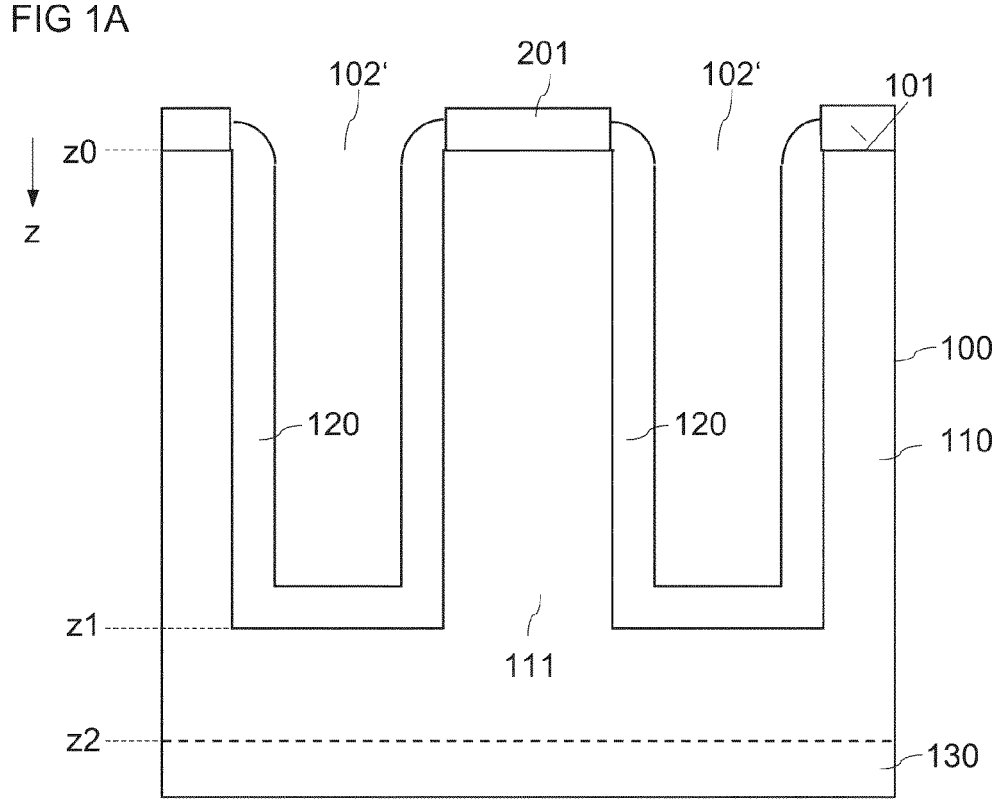

FIG. 1B shows a vertical cross-sectional view of the semiconductor body 100 after method steps in which a second semiconductor layer 120 has been formed on sidewalls and a bottom of the at least one trench 102. The second semiconductor layer 120 does not completely fill the at least one trench 102, so that a residual trench 102' remains. The first semiconductor layer 110 has a first doping type, and the second semiconductor layer 120 has a second doping type complementary to the first doping type, so that a pn-junction is formed between the second semiconductor layer 120 and the semiconductor mesa region 111. According to one embodiment, the first doping type of the first semiconductor layer 110 is an n-type, and the second doping type of the second semiconductor layer 120 is a p-type.

According to one embodiment, forming of the second semiconductor layer 120 includes an epitaxy process, in particular a selective epitaxy process. In this process the second semiconductor layer 120 is grown on the bottom and the sidewalls of the at least one trench 102. In this process, the etch mask 201 may remain on the first surface 101 where it prevents the epitaxial layer from being grown on the first surface 101. The epitaxial layer may partially overgrow the mask layer 102, so that sections of the epitaxial layer 120 may extend in the vertical direction to above the first surface 101 along the mask layer 201 where they will be removed in a later process step. Those sections of the epitaxial layer 102 that extend beyond the first surface along the mask layer 201 are schematically shown in FIG. 1B.

Forming the second semiconductor layer 120 using an epitaxy process is only an example. Other methods for forming the doped semiconductor layer 12 along the bottom and the sidewalls of the at least one trench 102, such as a doping process, can be used as well. This is explained in further detail below.

According to one embodiment, the second semiconductor layer 120 is produced to have a substantially homogeneous doping concentration.

The first semiconductor layer 110, and, therefore, the semiconductor mesa region 111, may have a doping concentration that varies in a direction in which the at least one trench 102 extends into the first semiconductor layer 110. In the embodiment shown in FIGS. 1A-1E, this direction corresponds to a vertical direction z of the first semiconductor layer 110. The "vertical direction" is a direction perpendicular to the first surface 101.

Figure 6:
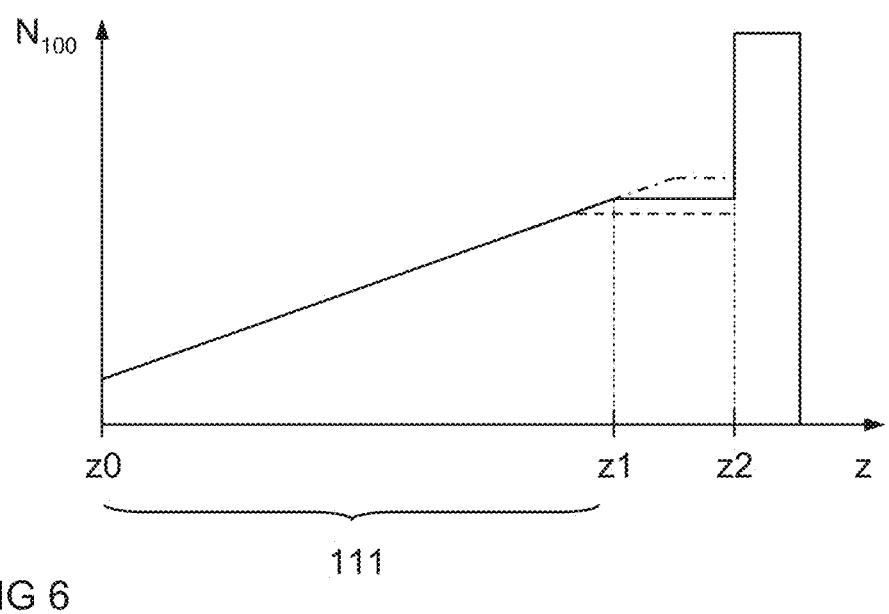
FIG. 6 illustrates one embodiment of a doping profile of the first semiconductor layer.

FIG. 6 schematically illustrates one embodiment of a doping profile of the semiconductor body 100 with the first semiconductor layer 110. FIG. 6 shows a doping concentration $N_{100}$ of the semiconductor body 100 over the vertical position z. Referring to FIG. 1B, z0 denotes a position of the first surface 101, z1 denotes a position of the bottom of the at least one trench 102, and z2 denotes the position of an interface between the first semiconductor layer 110 and the optional further semiconductor layer 130. The doping concentration between the first surface 101 (at position z0), and the bottom of the trench 102 (at position z1) corresponds to the doping concentration of the semiconductor mesa region 111.

Referring to FIG. 6, the doping concentration in the semiconductor mesa region 111 may continuously increase between the first surface 101 and the bottom of the trench 102. Between the bottom of the trench 102 and the further semiconductor layer 130, that is in the first semiconductor layer 110 between the bottom of the trench 102 and the further semiconductor layer 130, the doping concentration may be substantially constant. According to one embodiment, a maximum doping concentration of the mesa region 11 (at the position z0) is between $1E15$ cm$^{-3}$ and $9E15$ cm$^{-3}$, such as $5E15$ cm$^{-3}$, and a minimum doping concentration of the mesa region 11 (at the position z1) is between $1E16$ cm$^{-3}$ and $3E16$ cm$^{-3}$, such as $1.3E16$ cm$^{-3}$. According to one embodiment (illustrated in dashed lines in FIG. 6), the increase of the doping concentration stops in the mesa region 111, so that a lower section of the semiconductor mesa region 111, which is a section close to the bottom of the trench 102, has a substantially homogeneous doping concentration. According to another embodiment (shown in dashed and dotted lines in FIG. 6), the region where the doping concentration increases extends beyond the bottom of the trench 102, so that there is a section of the first semiconductor layer 110 below the bottom of the trench 102 where the doping concentration increases.

Referring to the explanation above, the first semiconductor layer 110 can be an epitaxially grown layer. In this case, the doping profile can be adjusted during the epitaxial growth process.

Figure 1C:
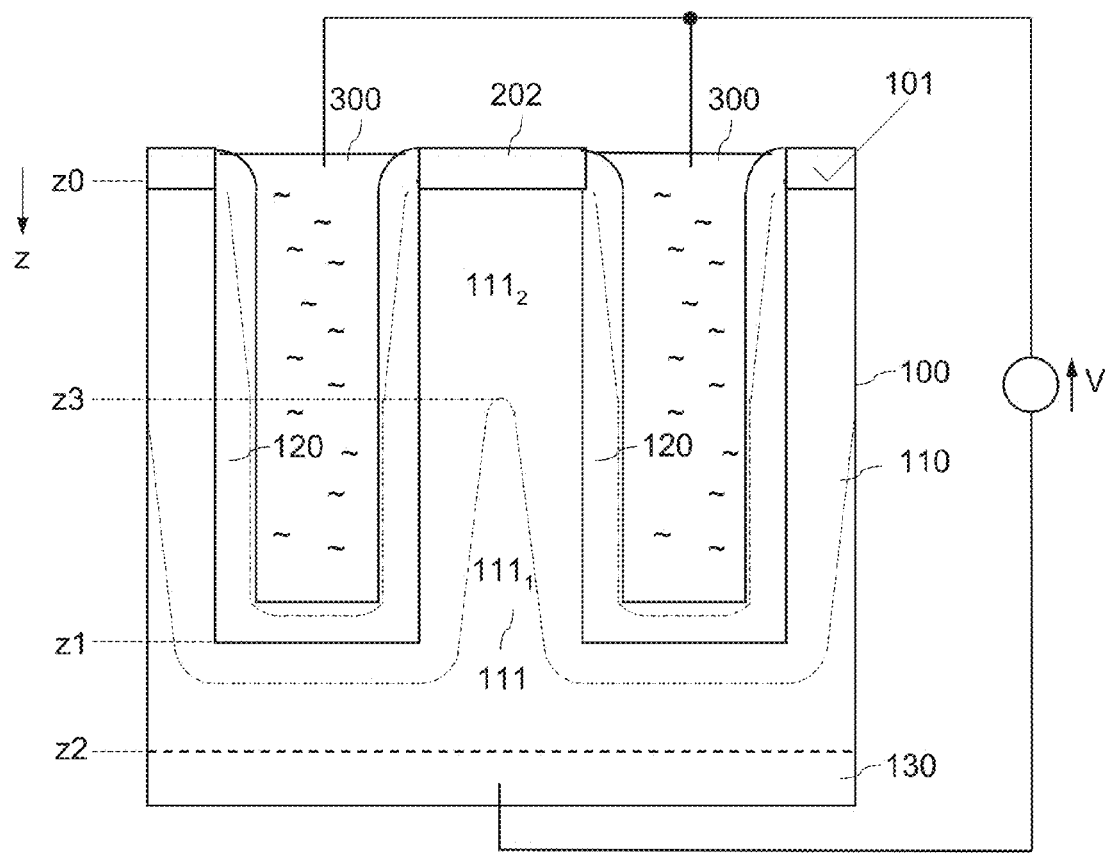

Referring to FIG. 1C, the method further includes etching the second semiconductor layer 120. Etching the second semiconductor layer 120 includes filling the at least one trench 102 with an etchant 300, and applying a voltage V between the etchant 300 and the first semiconductor layer 110. A polarity of this voltage V is such that the pn-junction between the first semiconductor layer 110, in particular the mesa region 111, and the second semiconductor layer 120 is reverse biased. In this case, a space charge region (depletion region) expands in the mesa region 111, in the first semiconductor layer 110 below the at least one trench 102, in the mesa region 111, and in the second semiconductor layer 120. Borders of this space charge region in the first semiconductor layer 110 and the second semiconductor layer 120 are schematically illustrated in dashed and dotted lines in FIG. 1C.

The etchant 300 is electrically conducting, so that applying the voltage V between the first semiconductor layer 110 and the etchant 300 causes the pn-junction to be reverse biased. According to one embodiment, the etchant 300 includes potassium hydroxide (KOH), or tetramethylammonium hydroxide (TMAH). Just for the purpose of explanation, it is assumed that the etchant 300 includes KOH, and the semiconductor material of the first and second semiconductor layers 110, 120 is silicon (Si).

The chemical reactions that take place when an etchant 300 including KOH is brought in contact with the silicon surface of the second semiconductor layer 120 can be described as follows:

  (1)

  (2)

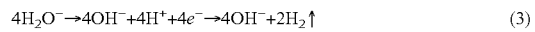  (3)

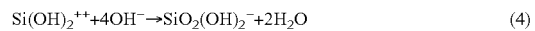  (4)

The overall etching process can be described as follows:

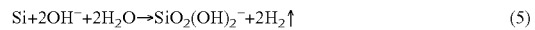  (5)

Referring to the chemical equation (5), silicon (Si) atoms from the second semiconductor layer 120 react with hydroxide ions (OH⁻) provided by the KOH, and water ($H_2O$) to result in an silicon-oxide-hydroxide complex ($SiO_2(OH)_2^-$) and hydrogen ($H_2$). The water is provided by the etchant 300 which is an aqueous KOH solution. The hydrogen ($H_2$) outgases, and the silicon-oxide-hydroxide complex is kept solved in the etchant 300.

Referring to equations (1)-(4), electrons (e⁻) are involved in the etching process in which silicon is removed from the first semiconductor layer 120. As the etching process proceeds and silicon from the second semiconductor layer 120 is removed down to the border of the space charge region, so that the space charge region extends to the surface of the second semiconductor layer 120, the etching process stops at those locations where the space charge region extends to the surface of the second semiconductor layer 120, that is, where the electrical field "punches through." At those locations, a current may flow from a voltage source providing the voltage V through the etchant 300, the second semiconductor layer 120, and the first semiconductor layer 110, so that electrons that are required in the etching process are removed from the surface of the second semiconductor layer 120, so that the etching process stops.

Figure 1D:
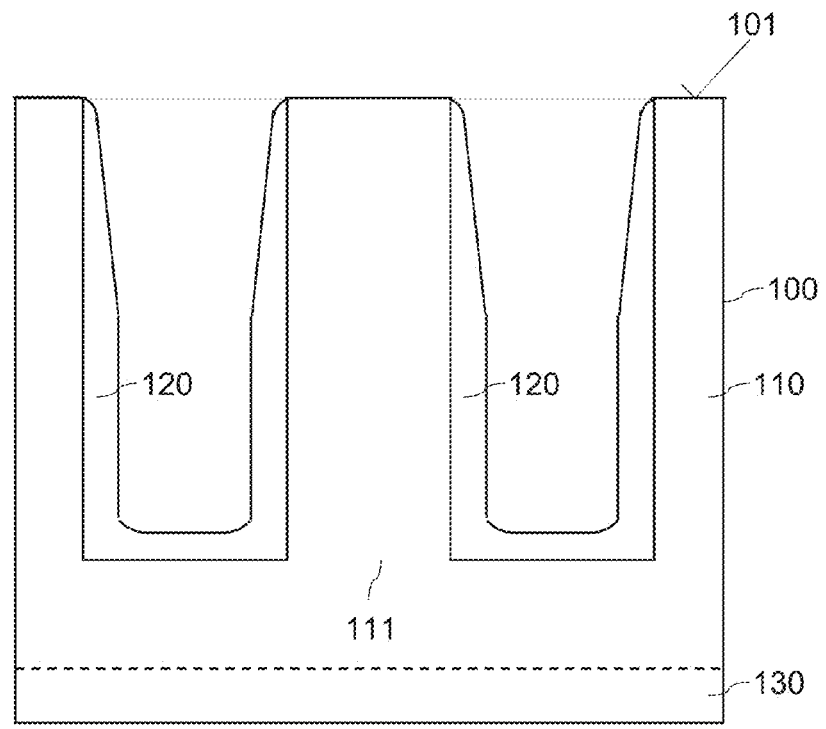

According to one embodiment, the etching process proceeds until the space charge region extends to each surface portion of the second semiconductor layer 120. In this case, a shape of the surface of the second semiconductor layer 120 after the etching process corresponds to the shape of the border of the space charge region in the second semiconductor layer 120. FIG. 1D shows a vertical cross-sectional view of the first and second semiconductor layers 110, 120 after the etching process, and after removing the insulation and mask layer 202.

Referring to FIG. 1C, the voltage V applied in the etching process between the first and second semiconductor layers 110, 120 is selected such that the mesa region 111 includes a first section $111_1$ that is free of the space charge region, and includes a second region $111_2$ that is completely covered by the space charge region. Referring to FIG. 1C, the second region $111_2$ is between the first surface 101 and the first region $111_1$. Referring to FIG. 1C, the second region $111_2$, in a lateral direction of the semiconductor body 100 (which is perpendicular to the vertical direction z), extends from the second semiconductor layer 120 at a sidewall of a first trench or trench section, respectively, to a second semiconductor layer 120 at a sidewall of a second trench or trench section, respectively. This second section $111_2$ is completely depleted of charge carriers in the etching process. The first section $111_1$ that is free of the space charge region (that is not depleted) is below the second region $111_2$ (as seen from the first surface 101) and between sections of the space charge region.

Applying the voltage V between the first and second semiconductor layers 110, 120 causes the space charge region to expand into the semiconductor mesa region 111 from a first pn-junction between the second semiconductor layer 120 in the first trench, and the pn-junction between the semiconductor mesa region 111 and the second semiconductor layer 120 in the second trench. In the second section $111_2$ of the semiconductor mesa region 111, these space charge regions touch each other, so that the second section $111_2$ is completely depleted of charge carriers, while in the first section $111_1$ the space charge regions expanding from the opposite pn-junctions are spaced-apart, leaving the first section $111_1$ free of the space charge region.

The illustration of the space charge region shown in FIG. 1C is based on the assumption that the semiconductor mesa region 111 has a doping profile as illustrated in FIG. 4, which is a doping profile in which a doping concentration of the mesa region 111 increases towards the bottom of the at least one trench. However, referring to the explanation herein below, other doping profiles are possible as well.

In the following, a "width of the space charge region" in the second semiconductor layer 120 is a distance between the pn-junction and the border of the space charge region. Referring to FIG. 1C, the width of the space charge region increases towards the bottom of the trench in a region adjacent the second section $111_2$. Within the space charge region there are ionized dopant atoms in the second semiconductor layer 120. These ionized dopant atoms have a negative charge when the second semiconductor layer 120 is p-doped. Opposite (positive) charges corresponding to the charges in the second semiconductor layer 120 are located in the second section $111_2$ of the mesa region 111. Since the doping concentration of the second section $111_2$ increases in the vertical direction z, the overall number of ionized dopant charges also increases in the vertical direction z. According to one embodiment, the second semiconductor layer 120 includes a substantially homogeneous doping concentration. In this case, the width of the space charge region increases in the vertical direction z, so that ionized dopant charges in the second section $111_2$ have corresponding counter charges in the second semiconductor layer 120.

Just for the ease off illustration, in FIG. 1C, the width w of the space charge region in the layer 120 adjacent the first section $111_1$ of the mesa region 111 is drawn to be substantially constant. However, by virtue of the doping concentration in the mesa region 111 increasing in the vertical direction towards the bottom of the at least one trench 102, there is also an increase of the width of space charge region in the semiconductor layer 120 adjacent the first section $111_1$. Specifically, the width of the space charge region increases towards the bottom of the at least one trench. However, the variation of the width of the space charge region in this lower region of the semiconductor layer 120 is smaller than in the upper section adjacent the second drift region section $111_2$, so that this variation is not illustrated in FIG. 1C.

Figure 7:
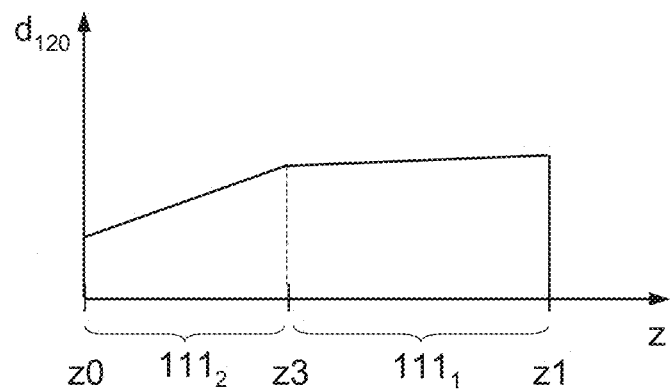
FIG. 7 illustrates one embodiment of a thickness of the second semiconductor layer.

FIG. 7 schematically illustrates a thickness $d_{120}$ of the second semiconductor layer 120 at opposite sidewalls of the two neighboring trenches or trench sections, respectively. FIG. 5 shows the thickness $d_{120}$ over the vertical position. In FIG. 5, z3 denotes the position of a lower end of the completely depleted second mesa region section $111_2$, which corresponds to an upper end of the non-depleted first mesa region section $111_1$. Referring to the explanation herein, the thickness $d_{120}$ of the second semiconductor layer 120 corresponds to the width of the space charge region in the second semiconductor layer 120. Thus, the thickness $d_{120}$ increases adjacent the second mesa region section $111_2$ between the first surface 101 and the position z3, and also increases in a region adjacent the first mesa region section $111_1$, but less than adjacent the first mesa region section $111_1$.

Figure 1E:
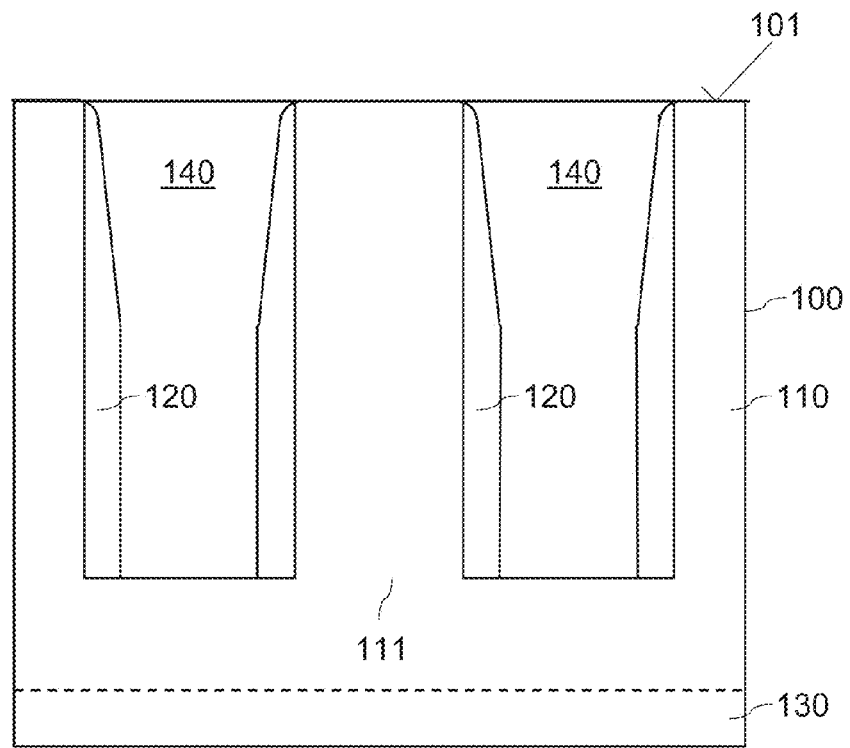

Referring to FIG. 1E, the method may further include removing the second semiconductor layer 120 from the bottom of the at least one trench, and filling the residual trench 102' with a filling material 140. Removing the second semiconductor layer 120 from the bottom of the at least one trench may include an anisotropic etching process. Filling the residual trench 102' may include an epitaxy process that epitaxially grows the filling material 140 on the bottom and the sidewalls of the residual trench 102', until the trench has been completely filled. The filling material 140 may include a substantially monocrystalline semiconductor material. This semiconductor material can be intrinsic.

FIGS. 2A-2I illustrates a further embodiment of a method for producing a semiconductor topology as shown in FIG. 1E that includes a mesa region 111 in a first semiconductor layer 110 of a first doping type, a second semiconductor layer 120 of a second doping type complementary to a first doping type along at least one side wall of a trench, and a filling material adjacent the second semiconductor layer 120.

Referring to FIG. 2A, the method includes forming at least one trench 102 in the first semiconductor layer 110. Forming the at least one trench 102 may include method steps explained with reference to FIG. 1A above. Concerning the shape of the at least one trench 102, the explanation provided in connection with FIG. 1A and FIGS. 3-5 apply to the at least one trench 102 illustrated in FIG. 2A accordingly. In FIG. 2A, two trenches or trench sections, respectively, are shown. The mesa region 111 is located between these two trenches or trench sections, respectively. However, it is also possible to form only one trench 102 and a vertical insulation region spaced apart in a horizontal direction from the trench 102. In this case, the mesa region 111 is a semiconductor region between the trench 102 and the vertical insulation region.

Referring to FIG. 2B, the method further includes forming the second semiconductor layer 120. In this embodiment the second semiconductor layer 120 is formed along the sidewalls and the bottom of the at least one trench 102, and along the first surface 101. Unlike the method explained with reference to FIG. 1B, forming the second semiconductor layer 120 includes introducing dopant atoms of the second doping type into the first semiconductor layer 110 along the sidewalls and the bottom of the at least one trench 102, and into the first surface 101 of the first semiconductor layer 110. Introducing the dopant atoms into the first semiconductor layer 110 may include exposing the sidewalls and the bottoms of the at least one trench 102 and the first surface 101 to a doping gas that includes the dopant atoms and from where the dopant atoms diffuse into the first semiconductor layer 110 so as to form the second semiconductor layer 120 illustrated in FIG. 2B.

Referring to FIG. 2D, the method optionally includes forming along the first surface 101 a third semiconductor layer 121 of the second doping type and more highly doped than the second semiconductor layer 120. Referring to FIG. 2C, this methods includes forming a protection layer 202 on the sidewalls of the at least one trench 102. Referring to FIG. 2D, the protection layer 202 covers the sidewalls of the at least one trench 102 during an implantation process in which dopant atoms of the second doping type are implanted into the first surface 101. According to one embodiment, this implantation process is a tilted process in which an implantation angle is different from a vertical direction of the semiconductor body 100. In this way, dopant atoms are implanted into the first surface 101, but not into the bottom of the at least one trench 102. Further, the dopant atoms are not implanted into the sidewalls of the at least one trench 102 that are covered by the protection layer 202.

Forming the protection layer 202 may include forming the protection layer all over the surface of the semiconductor body 100, that is on the first surface 101 and on the bottom and the sidewalls of the at least one trench 102, and removing the protection layer from the first surface 101 and from the bottom of the at least one trench 102. This removing process may include an anisotropic etching process. The protection layer 202, is for example, a thermal oxide layer, a deposited oxide layer, or the like.

Referring to FIG. 2E, the second semiconductor layer 120 is etched using a liquid etchant 300 in the way explained with reference to FIG. 1C herein before. However, in the method illustrated in FIG. 2E, not only the voltage V is applied between the first semiconductor layer 110 and the etchant 300, but a further voltage V' is applied between the first semiconductor layer 110 and the third semiconductor layer 121. The further voltage V' may correspond to the voltage V, or may be slightly lower than the voltage V. According to one embodiment, the voltage V applied between the first semiconductor layer 110 and the etchant 300 is about 25V and the further voltage V' is about 24V. According to one embodiment, the further voltage V' is between 1V and 5V lower than the voltage V. In the embodiment shown in FIG. 2E, the liquid level of the etchant 300 is below the third semiconductor layer 121, so as to avoid a short circuit between the two voltage source that provide the voltages V, V'. According to another embodiment (not shown), an insulation layer is produced on the third semiconductor layer 121 at least at the sidewall of the trench 102, so as to electrically insulate the etchant 300 from the third semiconductor layer 121 during the etching process.

The further voltage V' also reverse biases the pn-junction between the first and second semiconductor layers 110, 120. The higher doped third semiconductor layer 121 along the first surface 101 connects the voltage source that provides the further voltage V' to the second semiconductor layer 120 and helps to equally distribute the electric potential provided by this voltage source to the second semiconductor layer 120.

FIG. 2F illustrates the semiconductor body 100 after the etching process. Like in the embodiment explained with reference to FIGS. 1C and 1D, after the etching process, a width w of the second semiconductor layer 120 varies in the vertical direction in the same way as explained with reference to FIG. 1D.

In next method steps, illustrated in FIGS. 2G and 2A, the second semiconductor layer 120 and the third semiconductor layer 121 are removed along the first surface 101. Referring to FIG. 2G, this may include forming a further protection layer 203 along the sidewalls of the at least one trench 102. This further protection layer 203 can be formed using one of the process sequences explained with reference to forming the protection layer 202 shown in FIG. 2D. That is, forming the further protection layer 203 may include forming a protection layer all over the surface of the semiconductor body 100 and removing the protection layer from the first surface 101 and the bottom of the at least one trench using an anisotropic etching process. Referring to FIG. 2H, the second and third semiconductor layers 120, 121 are removed along the first surface 101, and along the bottom of the at least one trench. This may include an anisotropic etching process. During this etching process, the protection layer 203 protects the sidewalls of the at least one trench 102 from being etched. After this etching process, the further protection layer 203 is removed. A semiconductor topology obtained after removing the further protection layer 203 is illustrated in FIG. 2H. In FIG. 2H, reference character 101 denotes the first surface of the semiconductor body 100 after removing the second semiconductor layer 120 and the third semiconductor layer 121 along the first surface.

Referring to FIG. 2I, the trench 102 may then be filled with a filling material 140 in the same way as explained with reference to FIG. 1E herein before.

Figure 8:
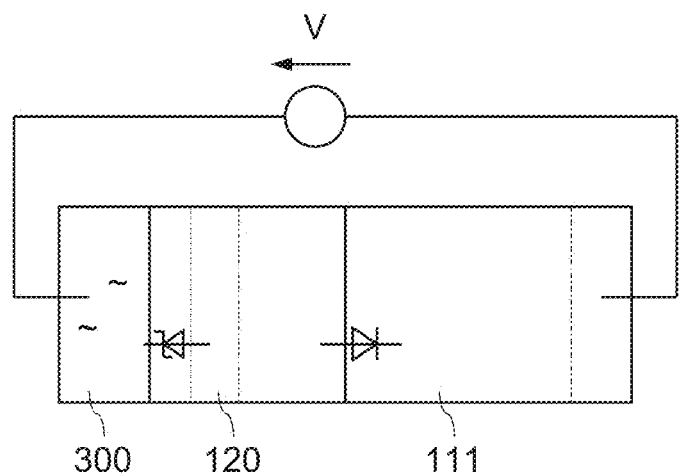
FIG. 8 shows a detail of the semiconductor arrangement shown in one of FIGS. 1C and 2D.

According to a further embodiment, the filling material 140 has a doping type complementary to the doping type of the second semiconductor layer 120. This is explained in further detail with reference to FIG. 8. FIG. 8 shows a section of the second semiconductor layer 120, a section of the mesa region 111 adjoining the second semiconductor layer 120, and a portion of the etchant 300 during the etching process in detail. A bipolar diode shown in FIG. 8 represents the pn-junction between the second semiconductor layer 120 and the mesa region 111. The pn-junction represented by the bipolar diode is reverse biased by the voltage V applied between the etchant 300 and the first semiconductor layer (110 in FIG. 1C) during the etching process. The dashed and dotted lines shown in FIG. 8 illustrate borders of the space charge region that expands on both sides of the pn-junction. Besides the space charge region expanding from the pn-junction, there is a further space charge region in the second semiconductor layer 120. The border of this space charge region is illustrated by a dotted line in FIG. 8. The etchant 300 and the second semiconductor layer 120 have an interface that is similar to a Schottky junction.

The Schottky diode shown in FIG. 8 represents this interface (junction) between the etchant 300 and the second semiconductor layer 120. This Schottky junction is forward biased when a voltage V is applied that reverse biases the pn-junction between the second semiconductor layer 120 and the mesa region 111. The further space charge region (the one represented by the dotted line in FIG. 8) is a space charge region that corresponds to the space charge region at a forward biased Schottky junction. In the embodiment illustrated in FIG. 8, this space charge region is narrower than the space charge region expanding from the pn-junction. Thus, a number of ionized dopant charges in the space charge region expanding from the Schottky junction is lower than a number of ionized dopant atoms in the space charge region expanding from the pn junction. However, the space charge region expanding from the Schottky junction causes the etching process to stop when the space charge region expanding from the pn-junction touches the space charge region expanding from the Schottky junction. This is before the space charge region expanding from the pn junction reaches the surface of the second semiconductor layer 120. Consequently, after the etching process, a number of dopant charges in the second semiconductor layer 120 adjacent the second mesa region section $111_2$ is higher than the number of dopant charges in the second mesa region $111_2$. A difference between the number of dopant charges in the second semiconductor layer 120 adjacent the second mesa region section $111_2$, and the number of dopant atoms in the second mesa region section $111_2$ corresponds to the number of dopant charges that is included in that region of the second semiconductor layer 120 that is covered by the space charge region expanding from the Schottky junction. Depending on the doping of the mesa region 111 and the semiconductor layer 120 it is even possible for the space charge region at the Schottky junction to be wider than the space charge region at the pn junction between the mesa region 111 and the semiconductor layer 120.

According to one embodiment, a doping concentration of the filling material 140 is such that an overall number of dopant charges in the filling material 140 corresponds to the number of dopant charges that is included in that region of the second semiconductor layer 120 that is covered by the space charge region expanding from the Schottky junction during the etching process. This number of dopant charges can be calculated based on the depth d of the at least one trench 102, the doping concentration of the second semiconductor layer 120, and a width of the space charge region expanding from the Schottky junction, wherein this width is dependent on the forward voltage of the Schottky junction.

Figure 9:
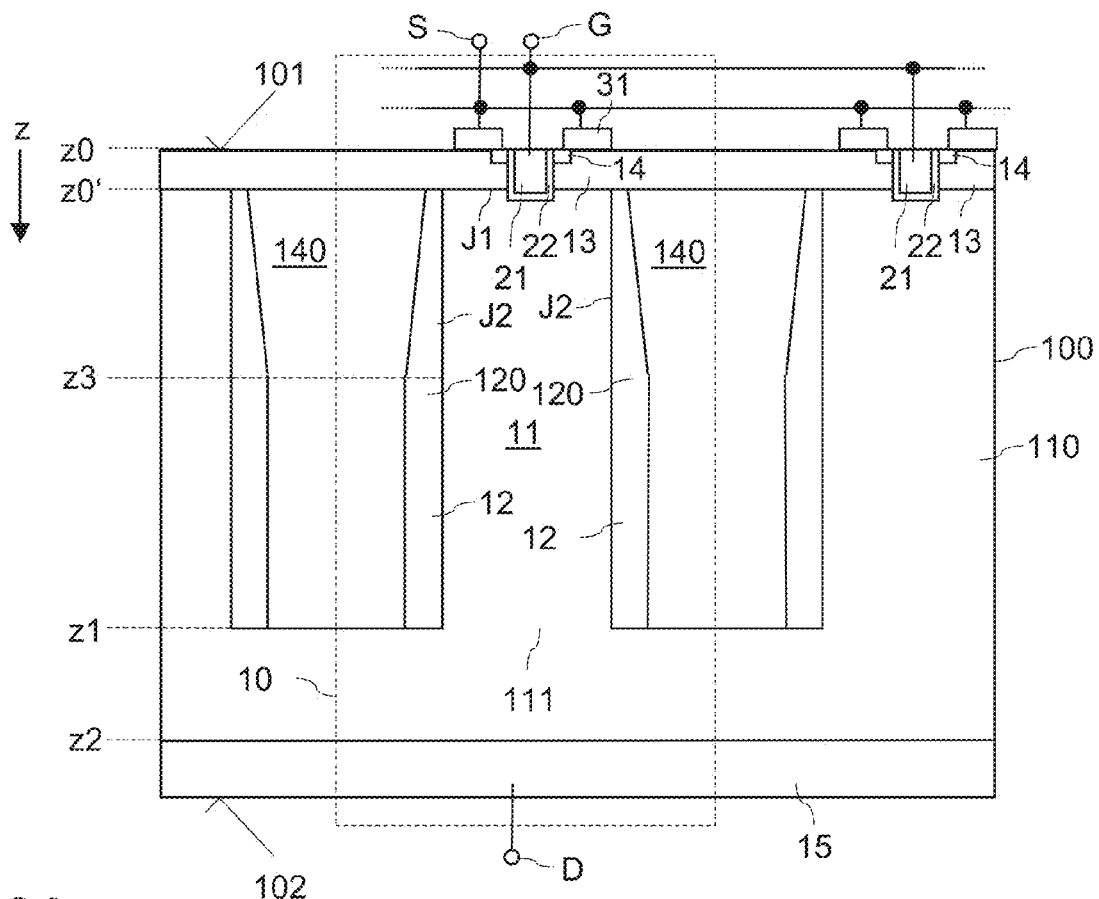
FIG. 9 shows a vertical cross-sectional view of one embodiment of an MOS transistor.

FIG. 9 shows a vertical cross-sectional view of a transistor device, specifically a MOSFET, that is based on the semiconductor topology shown in FIG. 1E. Referring to FIG. 9, the transistor device includes at least one transistor cell 10 including a drift region 11, and a compensation region 12. The compensation region 12 adjoins the drift region 11, and forms a pn-junction with the drift region 11. The drift region 11 of the at least one transistor cell 10 is formed by the semiconductor mesa region 111, and a section of the first semiconductor layer 110 between a bottom of the at least one trench and a drain region 15. The drain region 15 may have the same doping type as the first semiconductor layer 110, but may have a higher doping concentration. According to one embodiment, the drain region 15 is formed by the optional semiconductor substrate 130 explained hereinbefore. According to another embodiment, the drain region 15 is formed by implanting dopant atoms into the first semiconductor layer 110 over a second surface opposite the first surface 101.

The compensation region 12 of the at least one transistor cell 10 is formed by the at least one second semiconductor layer 120 adjoining the semiconductor mesa region 11. Dependent on the specific geometry of the at least one trench (102 in FIGS. 1A, 2 and 3) there may be one semiconductor layer 120 that surrounds the semiconductor mesa region 111 (when the at least one trench is ring-shaped), or there may be two second semiconductor layers 120 on opposite sides of the mesa region 111 (when two neighboring trenches are formed). According to yet another embodiment (not shown), there is only one second semiconductor layer 120 on one side of the mesa region 111, and one of the two trenches or trench sections shown in FIG. 9 is replaced by a trench or trench section filled with an insulating material.

Referring to FIG. 9, the at least one transistor cell 10 further includes a body region 13 adjoining the drift region 11. The body region 13 has a doping type complementary to the doping type of the drift region 11, so that a further pn-junction is formed between the drift region 11 and the body region 13. A source region 14 of the same doping type as the drift region 11 is separated from the drift region 11 by the body region 13. Further, a gate electrode is adjacent the body region 13 and dielectrically insulated from the body region 13 by a gate dielectric 22. The gate electrode 21 extends from the source region 14 to or into the drift region 11 adjacent the body region 13. In the embodiment shown in FIG. 9, the gate electrode 21 is a trench electrode, and the drift region 11 is spaced-apart from the source region 14 in vertical direction z of the semiconductor body 100. However, this is only an example. According to a further embodiment (not illustrated), the gate electrode 21 is a planar electrode above the first surface 101, a section of the drift region 11 extends to the first surface 101, and the source region 14 is spaced-apart from the drift region 11 in a lateral direction of the semiconductor body 100.

The body region 13 can be formed by introducing dopant atoms over the first surface 101 into the semiconductor body 100. According to one embodiment, forming the body region 13 includes an unmasked implantation process, so that the body region 13 adjoins the mesa region 111, the at least one second semiconductor layer 120 forming the compensation region 12, and the filling material 140. The source region 14 can be formed by introducing dopant atoms into the body region 13. The gate electrode 21, and the gate dielectric 22 can be formed by etching a trench that extends through the body region 13 into the drift region 11, by forming the gate dielectric 22 on a bottom and sidewalls of the trench, and by filling a residual trench remaining after forming the gate dielectric 22 with an electrode material that forms the gate electrode 21. A doping concentration of the source region 14 is, for example, between $1E18$ cm$^{-3}$ and $1E21$ cm$^{-3}$, a doping concentration of the body region 13 is, for example, between $5E15$ cm$^{-3}$ and $5E18$ cm$^{-3}$. A doping concentration of the drain region 15 can be in the same range as the doping concentration of the source region 14.

Referring to FIG. 9, the source region 14 and the body region 13 are electrically coupled to a source electrode 31 that is coupled to a source terminal S. The gate electrode 21 is electrically coupled to a gate terminal G, and a drain region 15 is electrically coupled to a drain terminal D.

According to one embodiment, the transistor device includes a plurality of transistor cells that are connected in parallel by having the gate electrodes 21 of the individual transistor cells connected to the gate terminal G, and by having the source and body regions 14, 13 of the individual transistor cells 10 connected to the source terminal S. The drain region 15 may be common to the individual transistor cells 10.

The transistor device shown in FIG. 9 can be operated like a conventional MOSFET. For explanation purposes, it is assumed that the MOSFET is an n-type MOSFET with an n-type drift region 11, an n-type source region 14, an n-type drain region 15, and a p-type body region 13. The transistor device is in an on-state when the gate electrode 21 generates a conducting channel in the body region 13 between the source region 14 and the drift region 11 along the gate dielectric 22. This conducting channel can be generated by applying a suitable drive potential to the gate terminal G. In an n-type MOSFET generating a conducting channel in the body region 13 requires a positive electrical potential at the gate terminal G relative to the electrical potential of the source terminal S (a positive gate-source voltage). When the transistor device is in the on-state, a current can flow between the drain and source terminals D, S, when a voltage is applied between these terminals.

The transistor device can be implemented as an enhancement MOSFET. In this case, the body region 13 adjoins the gate dielectric 22 (as illustrated in FIG. 9). According to another embodiment, the body region 13 includes a channel region of the same doping type as the source region 14 along the gate dielectric 22. In this case, switching off the transistor device requires a gate-source voltage other than zero to be applied at gate and source terminals G, S. In case of an n-type transistor device, a negative gate-source voltage is required in order to switch off the transistor device.

The transistor device is in the off-state, when a conducting channel in the body region 13 between the source region 14 and the drift region 11 is interrupted. When a voltage is applied between the drain and source terminals D, S that reverse biases the pn-junction between the drift region 11 and the body region 13, a space charge region expands mainly in the drift region 11 beginning at the pn-junction between the drift region 11 and the body region 13. This pn-junction will be referred to as first pn-junction J1 in the following. The space charge region expanding from the first pn-junction J1 mainly expands in the vertical direction z of the semiconductor body 100.

Since the at least one compensation region 12 adjoins the body region 13, at the same time a space charge region expands beginning at the first pn-junction J1, a space charge region begins to expand at the at least one second pn-junction J2 between the at least one compensation region 12 and the drift region 11. This space charge region mainly expands in a horizontal (lateral) direction of the mesa region 111.

Figure 10:
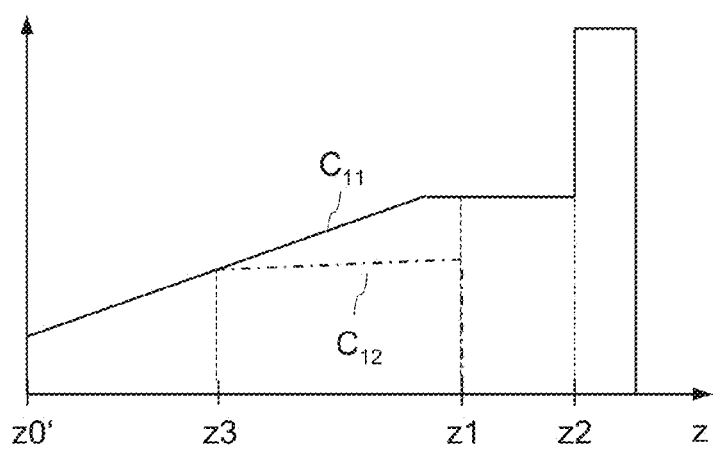
FIG. 10 illustrates dopant charges in a mesa region of the first semiconductor layer, and in the second semiconductor layer in the MOS transistor shown in FIG. 9.

FIG. 10 illustrates a charge balance between dopant charges in the semiconductor mesa region 111 and the at least one compensation region 12. $C_{11}$ denotes an amount of dopant charges in the drift region 11 over the vertical position z, and $C_{12}$ denotes the amount of dopant charges in the at least one compensation region 12 over the vertical position z. In the drift region 11, the amount of dopant charges $C_{11}$ at a specific vertical position z is given by the doping concentration of the drift region 11 at this position multiplied by the area of the drift region 11 in the horizontal plane of the semiconductor body 100 at this specific position z. The amount of dopant charges of the at least one compensation region 12 at a specific position z is given by the doping concentration of the compensation region 12 multiplied by the area of the at least compensation region 12 in the horizontal plane. This area is proportional to the width of the compensation region 12. In an embodiment in which the drift region 11 includes a mesa region 111 between two elongated trenches and in which there are two compensation regions 12 on opposite sides of the mesa region 111, the amount of dopant charges at one position z of the mesa region 111 is proportional to the dopant concentration, and proportional to a width w2 of the mesa region 111 at this position. In this case, the amount of dopant charges of the at least one compensation region 12 is proportional to the doping concentration of the second semiconductor layer 120, and to the width of the second semiconductor layer 120.

In FIG. 10, z0' denotes a position of a lower end of the body region 13, i.e., the position of the first pn-junction J1. Between this lower end of the body region 13 and the position z3 which, referring to FIG. 1C, is the position of an upper end of the non-depleted first section $111_1$, the drift region 11 and the compensation region 12 are substantially balanced, that is at each vertical position in the vertical range [z0', z3] the amount of dopant charges of the drift region 11 corresponds to the amount of dopant charges in the at least one compensation region 12. This is by virtue of applying a voltage V during the etching process that completely depletes the second section $111_2$ of the mesa region 111. If the filling material 140 includes an intrinsic semiconductor material, there may be a slight unbalance in favor of the compensation region 12. That is there may be a higher amount of dopant charges in the at least one compensation region 12 than in the drift region 11. However, this unbalance may be equalized when the filling material 140 includes a semiconductor material of a doping type complementary to the doping type of the compensation region 12.

Alternatively, the semiconductor layer 120 is made thinner before filling the trench 120 with the filling material 140 in order to remove a part of the doping charges included in the layer 120. This may include thermally oxidizing the surface of the semiconductor layer 120 and removing the resulting oxide layer (not shown) before filling the trench 102 (as shown in FIG. 1E). In particular, when the semiconductor layer 120 is a p-type layer, dopant atoms will be included in the oxide layer (this is known as pile effect), so that after removing the oxide layer the remaining semiconductor layer 120 includes less dopant charges than before. The amount of dopant charges that are removed can be adjusted by the thickness of the oxide layer, wherein the thickness of the oxide layer can be adjusted by the duration of the oxidation process. The thickness of the oxide layer increase as the duration of the oxidation process increases.

Below the position z3 that is farther away from the first surface 101 and the lower end of the body region 13, the amount of dopant charges in the at least one compensation region 12 is substantially constant at each vertical position, while the amount of dopant charges in the drift region 11 increases towards a lower end of the at least one compensation region 12 A position of the lower end of the at least one compensation region 12 corresponds to the position z1 of the bottom of the at least one trench 102 shown in FIG. 1A. Between this position z3 and the lower end of the compensation region 12, the drift region 11 and the compensation region 12 are unbalanced in favor of the drift region 11. In other words, there is a higher amount of dopant charges in the drift region 11 than in the compensation region 12. This is by virtue of leaving the first section $111_1$ non-depleted in the etching process. The difference between the dopant charges in the compensation region 12 at one vertical position z and the dopant charges of the drift region 11 at this vertical position z corresponds to the amount of dopant charges that is included in the non-depleted section $111_1$ at this position z in the etching process.

The section of the drift region 11 in which the dopant charges are balanced will be referred to as upper drift region section in the following, a section of the drift region 11 which is in the mesa region 111 and in which the dopant charges are unbalanced will be referred to as mid drift region section in the following, and a section of the drift region 11 between the at least one compensation region 12 and the drain region 15 will be referred to as lower drift region section. Since the lower drift region section only includes n-type dopant charges, there is also an unbalance of dopant charges in this section.

The balance of dopant charges in the upper drift region section, and the unbalance in the mid drift region section causes a an electric field that is associated with the space charge regions expanding from the first and second pn-junctions J1, J2 to have a maximum between the lower end of the body region 13 and the lower end of the compensation region 12. In other words, the maximum of the electric field is within the semiconductor mesa region 111. This is explained with reference to FIG. 9 below.

Figure 11:
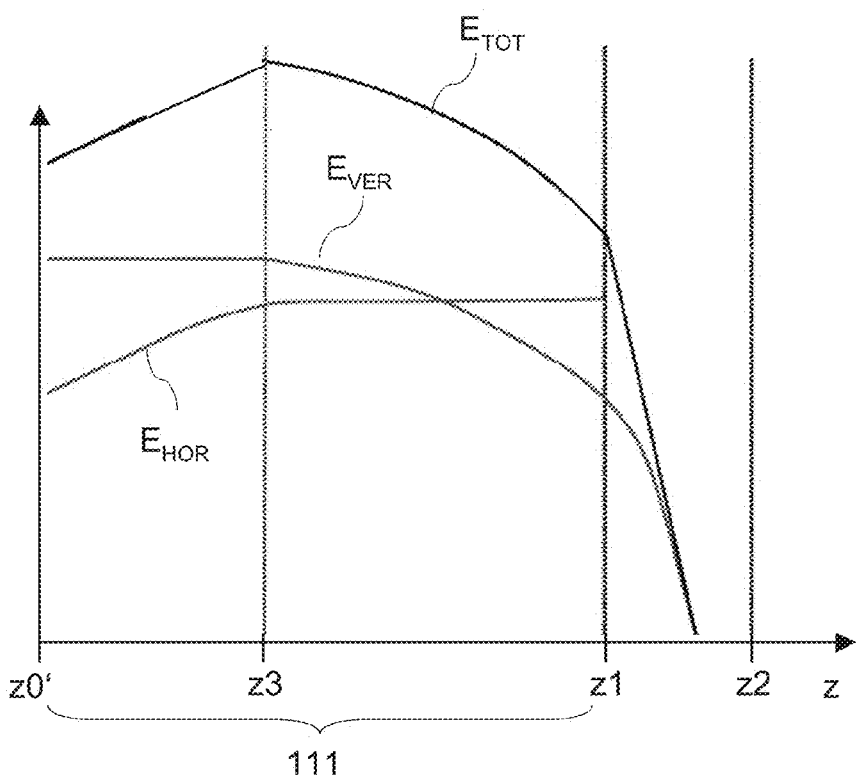
FIG. 11 illustrates an electric field in the mesa region of the semiconductor device shown in FIG. 9 in one operation state of this semiconductor device.

FIG. 11 schematically illustrates a magnitude of a vertical electrical field $E_{VER}$, and a magnitude of a horizontal electrical field $E_{HOR}$ in the mesa region 111 and between the mesa region 111 and the drain region 15 when the semiconductor device is in the off-state, and when a voltage is supplied between the drain and source terminals D, S that reverse biases the first and second pn-junctions J1, J2. The vertical electrical field $E_{VER}$ results from reverse biasing the first pn-junction J1 and is substantially directed in the vertical direction z of the semiconductor body 100. The horizontal electrical field $E_{HOR}$ results from reverse biasing the second pn-junction J2, and is substantially directed in the horizontal direction of the semiconductor body. In the upper mesa region (between the vertical positions z0' and z3), where there is a substantially exact charge balance the horizontal electrical field $E_{HOR}$ increases towards the position z3, because towards this position z3 the number of charge carriers on both sides of the second pn-junction J2 increases. The vertical electrical field $E_{VER}$ is substantially constant in the upper drift region section.

In the mid-drift region section (between vertical positions z3 and z1), the horizontal electrical field $E_{HOR}$ is substantially constant, because the number of compensated charge carriers in the compensation region 12 is substantially the same at each vertical position in this second drift region section. The vertical electrical field decreases in this drift region section because the region is unbalanced in favor of the drift region 11. In the lower drift region section (below the vertical position z1) the horizontal electrical field $E_{HOR}$ is substantially zero (because there is no compensation region 12 below this vertical position) and the vertical electrical field $E_{VER}$ further increases, wherein the vertical electrical field $E_{VER}$ reaches zero before the vertical position z2, where the drain region 15 starts.

The overall electrical field $E_{TOT}$ can be obtained by adding the field vector of the vertical electrical field $E_{VER}$ and the field vector of the horizontal electrical field $E_{HOR}$, and by calculating the magnitude of the resulting field vector. The magnitude of the overall electrical field can be calculated as follows:

$$E_{TOT}=\sqrt{E_{HOR}^2+E_{VER}^2} \quad (6)$$

The magnitude of the overall electrical field $E_{TOT}$ is also illustrated in FIG. 11. Referring to FIG. 11, the overall electrical field $E_{TOT}$ reaches a maximum substantially at the position z3 which is located between the lower end of the body region 13 and the lower end of the at least one compensation region 12 in the mesa region 111. This position z3 where the maximum of the electrical field occurs corresponds to a lower end of the second mesa region section $111_2$ that is completely depleted during the etching process (so that there is a substantially exact charge balance in this mesa region section $111_2$ after the etching process). A distance of this position z3 to the lower end of the body region 13, and to the lower end of the compensation region 12 can be adjusted through the doping profile of the mesa region 111, and the voltage V applied during the etching process. According to one embodiment, these parameters are selected such that a distance of this position z3 to the first surface 101 of the semiconductor body 100 is between 40% and 60% of the depth d of the at least one trench 102. Since a vertical dimension of the body region 13 is usually small as compared to the trench depth d, a distance between the position z3 and the first surface 101 substantially corresponds to the distance between the position z3 and the lower end of the body region 13. Thus, a distance between the position z3 and the lower end of the body region 13 is substantially between 40% and 60% of a vertical length of the at least one compensation region 12. The "vertical length" of the at least one compensation region 12 is the distance between the lower end of the body region 13 (at z0') and the former bottom of the at least one trench (at z1).

Figure 12:
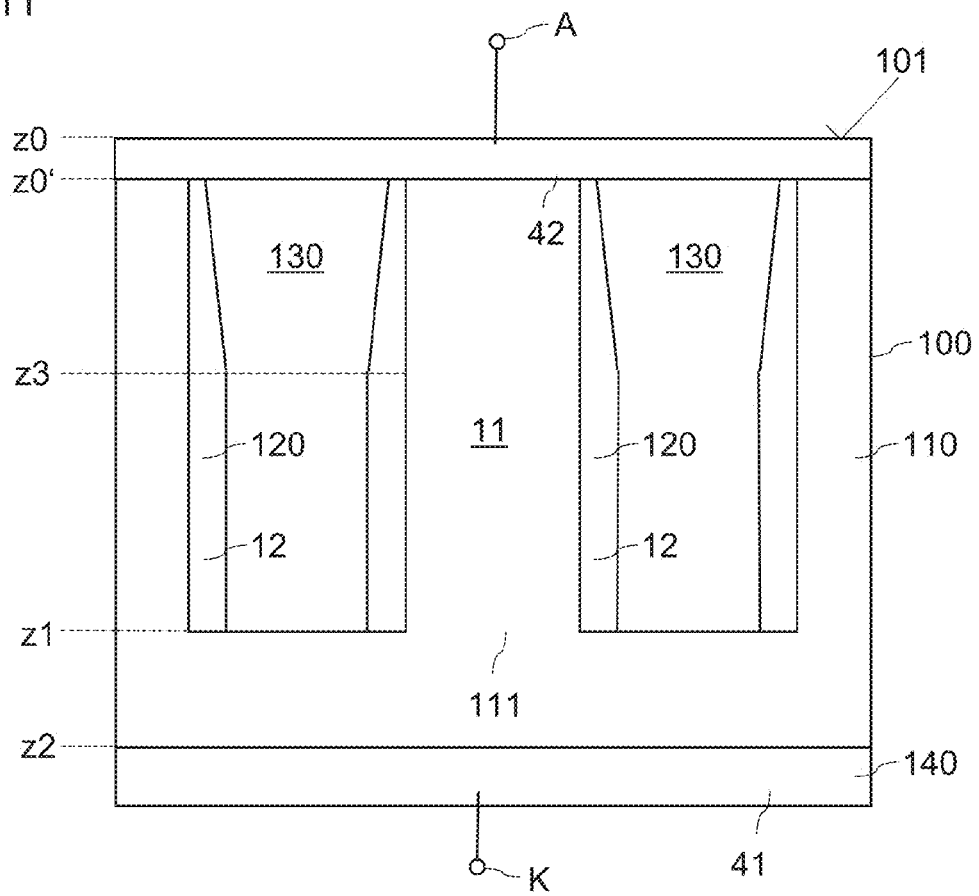
FIG. 12 illustrates one embodiment of a diode.

The drift region 11, and the at least one compensation region 12 as explained hereinbefore are not restricted to be used in a MOSFET as illustrated in FIG. 9. FIG. 12 shows a vertical cross-sectional view of a diode that is based on a semiconductor topology as shown in FIG. 1E.

This diode can be implemented as a bipolar diode and includes a first emitter region 41 adjoining the drift region 11 spaced-apart from the at least one compensation region 12, and a second emitter region 42 adjoining the drift region 11 and the at least one compensation region 12. A doping type of the first emitter region 41 corresponds to the doping type of the drift region 11, wherein the first emitter region 41 is higher doped. A doping type of the second emitter region 42 corresponds to a doping type of the at least one compensation region 12. According to one embodiment, the first emitter region 41 is n-doped, and the second emitter region 42 and the at least one compensation region 12 are p-doped. A Schottky diode can be obtained by replacing the second emitter region 42 in the device shown in FIG. 12 with a Schottky metal.

Figure 13:
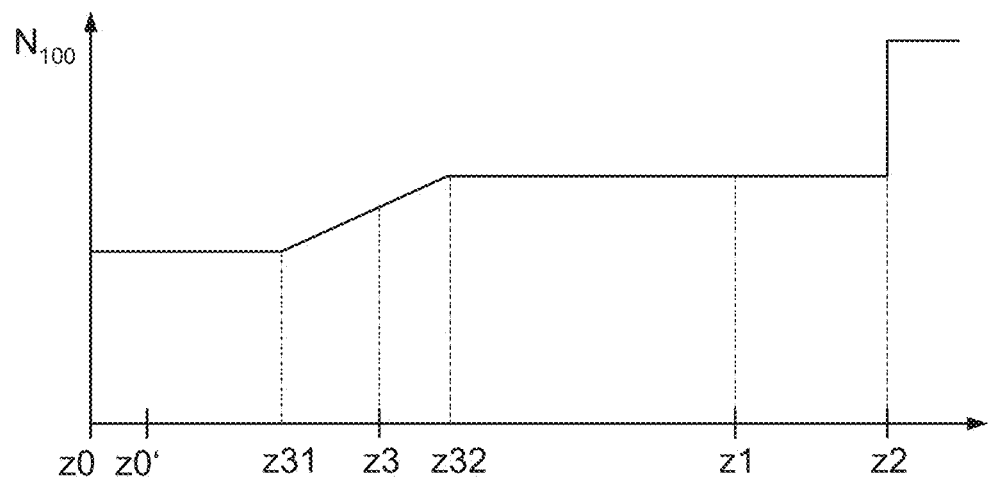
FIG. 13 shows a doping profile of the first semiconductor layer according to a further embodiment.

FIG. 13 shows a further embodiment of a doping profile of the first semiconductor layer 110. In this embodiment, the doping concentration $N_{100}$ increases from a first doping level at a first position z31 to a second doping level at a second position z32. The first position z31 is distant to the first surface 101 (represented by the position z0 in FIG. 13), and the doping concentration is substantially constant between the first surface 101 and this first position z31. The doping concentration in this region may correspond to the minimum doping concentration explained with reference to FIG. 7. The second position z32 is distant to the first position z31 and distant to a bottom of the at least one trench (represented by the position z1 in FIG. 13). Between the second position z32 and the bottom of the trench a doping concentration is substantially constant. The doping concentration in this region may correspond to the maximum doping concentration explained with reference to FIG. 7. In FIG. 11, z3 denotes a lower end of the second mesa region section $111_2$ (see FIG. 1C) that is completely depleted during the etching process. The lower end z3 is between the first and second positions z31, z32, wherein the exact position of this lower end z3 of the completely depleted region $111_2$ can be adjusted through the voltage V applied in the etching process. At a relatively low voltage V, the position z3 is close to the first position z31, and at a relatively high voltage, the position z3 is close to the second position z32. This voltage is, for example, between 10V and 100V, in particular between 10V and 50V.

Figure 14:
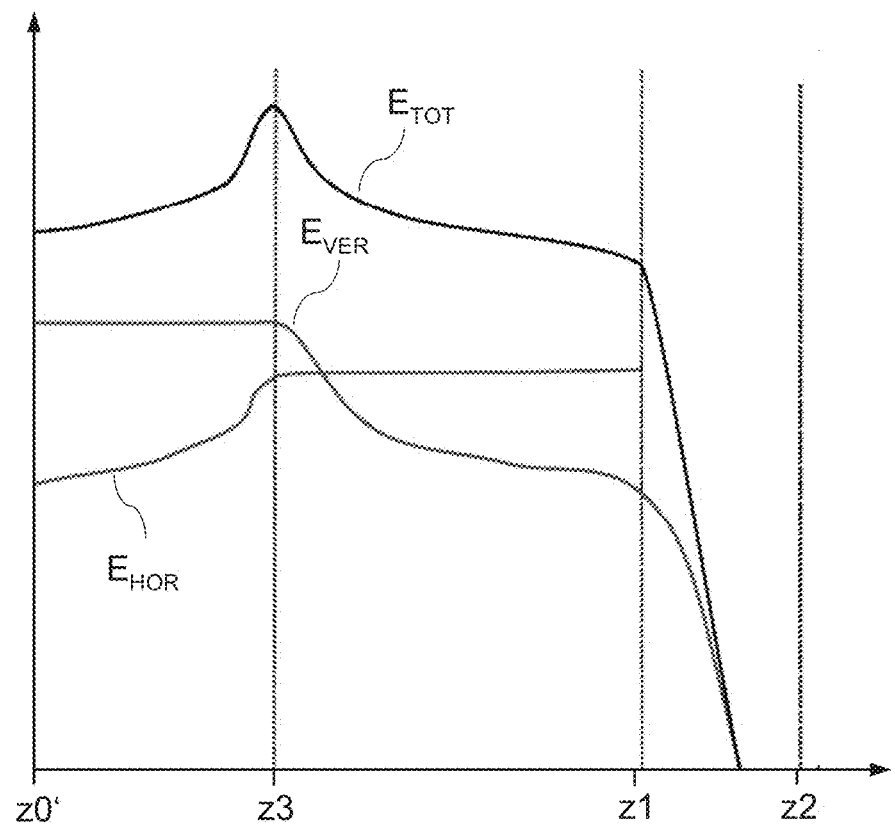
FIG. 14 illustrates the electric field in the mesa region of a semiconductor device that includes a first semiconductor layer with a doping profile as illustrated in FIG. 13.

FIG. 14 shows magnitudes of the horizontal electrical field $E_{HOR}$, the vertical electrical field $E_{VER}$, and the overall electrical field $E_{TOT}$ in a semiconductor device, such as the MOSFET shown in FIG. 9, or the diode shown in FIG. 10, when implemented with first semiconductor layer 110 having a doping profile as illustrated in FIG. 11. Like in the embodiment explained with reference to FIG. 11, a maximum of the overall electrical field is at a position z3, which corresponds to a lower end of the completely depleted region $111_2$ in the etching process.

In the embodiments explained hereinbefore, the at least one trench 102 has substantially vertical sidewalls, so that the width w2 (see FIG. 1A) of the semiconductor mesa region 101 is substantially constant. In this case, the overall dopant charges at a specific vertical position z of the mesa region 111 can be adjusted through the doping profile of the first semiconductor layer 110. Alternatively or additionally to adjusting the overall dopant charges at a specific vertical position z of the mesa region 111 through the doping profile of the first semiconductor layer 110, the overall dopant charges at a specific position z of the mesa region 111 can be adjusted by varying the width w2 of the mesa region 111. The width w2 of the mesa region varies when the at least one trench 102 is produced to have tapered sidewalls.

Figure 15A:
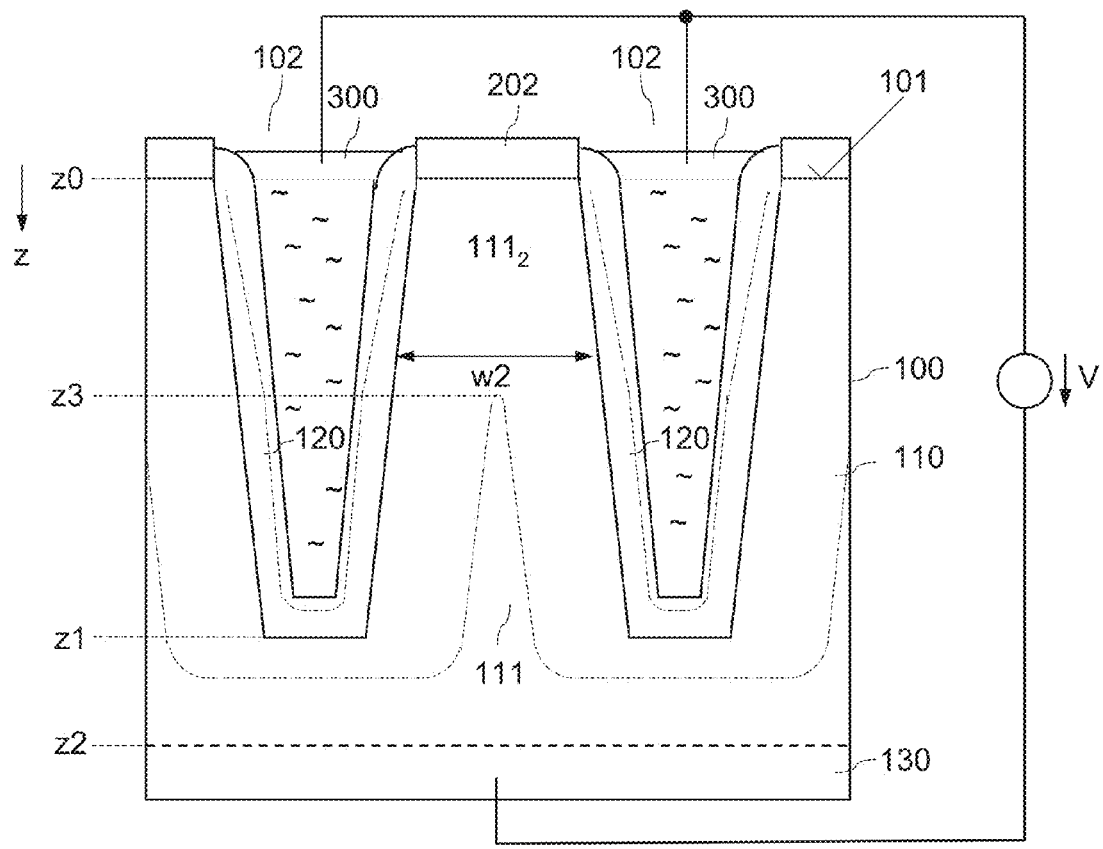
FIGS. 15A-15B illustrate a method for producing a drift region and a compensation region of a semiconductor device according to a further embodiment.

FIG. 15A shows a vertical cross-sectional view of a semiconductor body 100 including at least one trench 102 having tapered sidewalls, and a second semiconductor layer 120 on sidewalls and a bottom of the at least one trench during the etching process. The at least one trench 102 has tapered sidewalls such that a width w2 of the semiconductor mesa region 111 increases towards a bottom (at the vertical position z1) of the at least one trench 102. This increase of the width w2 towards the bottom of the at least one trench has the effect that an amount of dopant charges in one horizontal layer (at one vertical position z) of the mesa region 111 increases towards the bottom of the at least one trench 102, because a horizontal area of the mesa region 111 increases towards the bottom of the at least one trench. This makes it possible to apply a voltage V during the etching process that completely depletes a second drift region section $111_2$ (between the first surface 101 and a vertical position z3), and that leaves a first section $111_1$ of the mesa region 101 non-depleted. In the embodiment shown in FIG. 15A, the non-depleted region $111_1$ is below the vertical position z3. The exact position of z3 can be adjusted through the voltage V applied in the etching process.

Referring to FIG. 15A, a width of the space charge region (the border of which is illustrated in dashed and dotted lines) in the second semiconductor layer 120 increases adjacent second mesa region section $111_2$ towards the bottom of the at least one trench 102, because the amount of dopant charges in the mesa region 111 increases by virtue of the described widening of the mesa region 111. Adjacent the first mesa region $111_1$, the width of the space charge region in the second semiconductor layer 120 also increases, but less than between the positions z0 and z3. However, this increase is not illustrated in FIG. 15A.

Figure 15B:
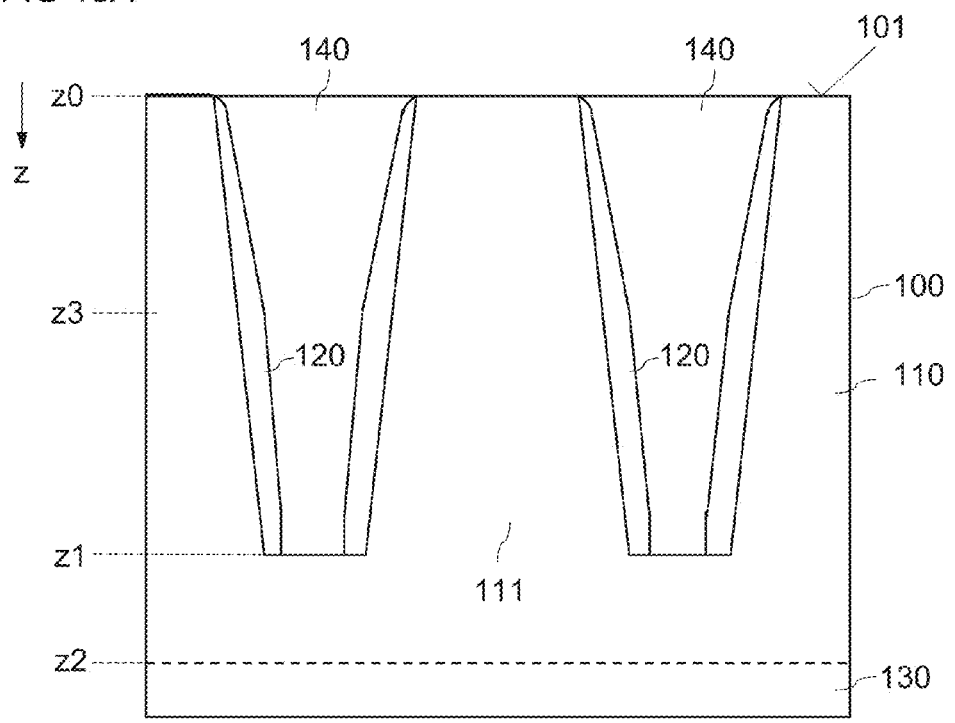

FIG. 15B shows the semiconductor body 100 after the etching process and after filling the at least one residual trench with a filling material. The explanations provided hereinbefore concerning the filling material 140 apply to the embodiment shown in FIGS. 15A and 15B equivalently.

Figure 16:
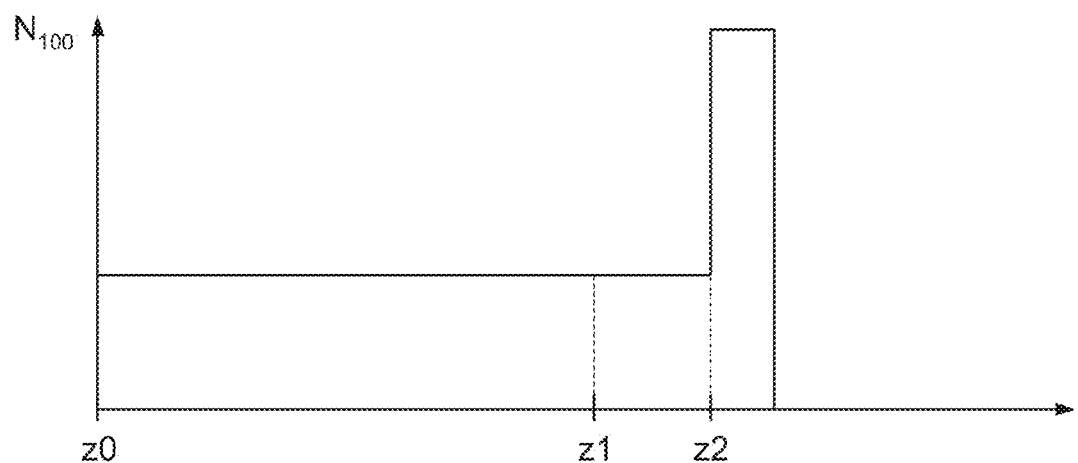
FIG. 16 illustrates a doping profile of a first semiconductor layer in the semiconductor arrangement shown in FIG. 15A-15B.

FIG. 16 shows one embodiment of a doping profile of the first semiconductor layer 110 shown in FIGS. 15A and 15B. According to this embodiment, a doping concentration of the first semiconductor layer 110 is substantially constant. The doping concentration is, for example, between $1E15$ cm$^{-3}$ and $2E16$ cm$^{-3}$, in particular between $5E15$ cm$^{-3}$ and $1E16$ cm$^{-3}$. According to one embodiment, an angle between the sidewalls of the trench 102 an the vertical direction is about 1.5°, a width of the mesa region 111 in the region of the first surface 101 is about 2 μm, and a width of the mesa region 111 in the region of the bottom of the trench 102 is about 8 μm.

However, it is also possible to implement the first semiconductor layer 110 with a doping profile as explained with reference to one of FIGS. 6 and 13. In this case, not only a widening of the mesa region 111 towards a bottom of the trench 102, but also the doping profile causes the amount of dopant charges in the mesa region 111 to increase, at least in sections, towards the bottom of the at least one trench 102.

Figure 17:
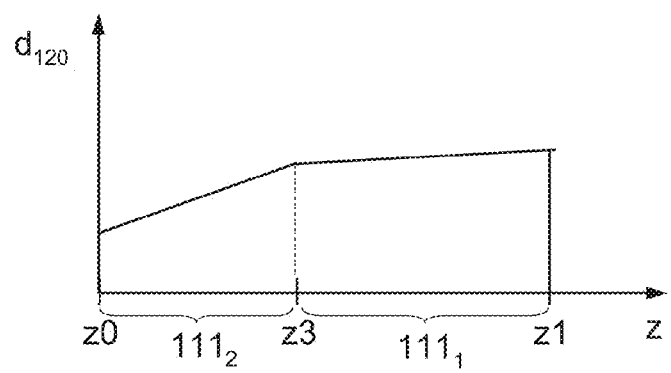
FIG. 17 illustrates a width of a second semiconductor layer shown in FIGS. 15A-15B.

FIG. 17 schematically illustrates the thickness $d_{120}$ of the second semiconductor layer 120 over the vertical position z after the etching process. As explained with reference to FIGS. 15A and 15B, the thickness $d_{120}$ increases between the first surface z0 and the vertical position z3 corresponding to the lower end of the completely depleted mesa region section $111_2$. Between this position z3 and the bottom of the at least one trench, the thickness $d_{120}$ increases further, but less than between the positions z0 and z3.

Figure 18:
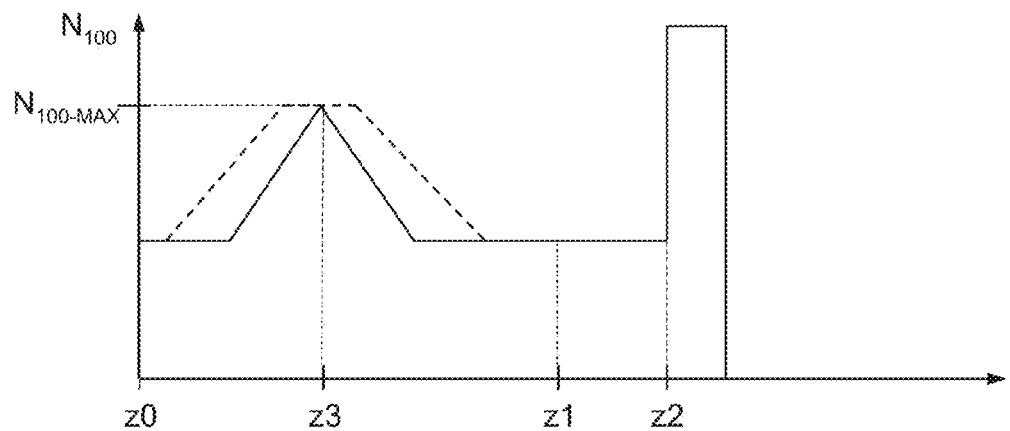
FIG. 18 illustrates a doping profile of a first semiconductor layer according to a further embodiment.

FIG. 18 illustrates a further embodiment of a doping profile of the first semiconductor layer 110. In this embodiment, the doping concentration has a maximum $N_{100-MAX}$ at a vertical position z3, which is between the first surface (at position z0) of the semiconductor body 100, and the bottom of the at least one trench. According to one embodiment, the distance between the position z3 and the first surface 101 is between 40% and 60% of the trench depth d. At least at the first surface 101, and at least at the bottom of the trench the doping concentration of the first semiconductor region 110 is lower than the maximum doping concentration $N_{100-MAX}$. The doping concentration may increase from the position z0 of the first surface 101 towards the maximum position z3 in an arbitrary way (wherein FIG. 18 only shows two possible embodiments, in solid lines and dashed lines), and the doping concentration may decrease from the maximum position z3 towards the bottom of the trench z1 in an arbitrary way.

Figure 19A:
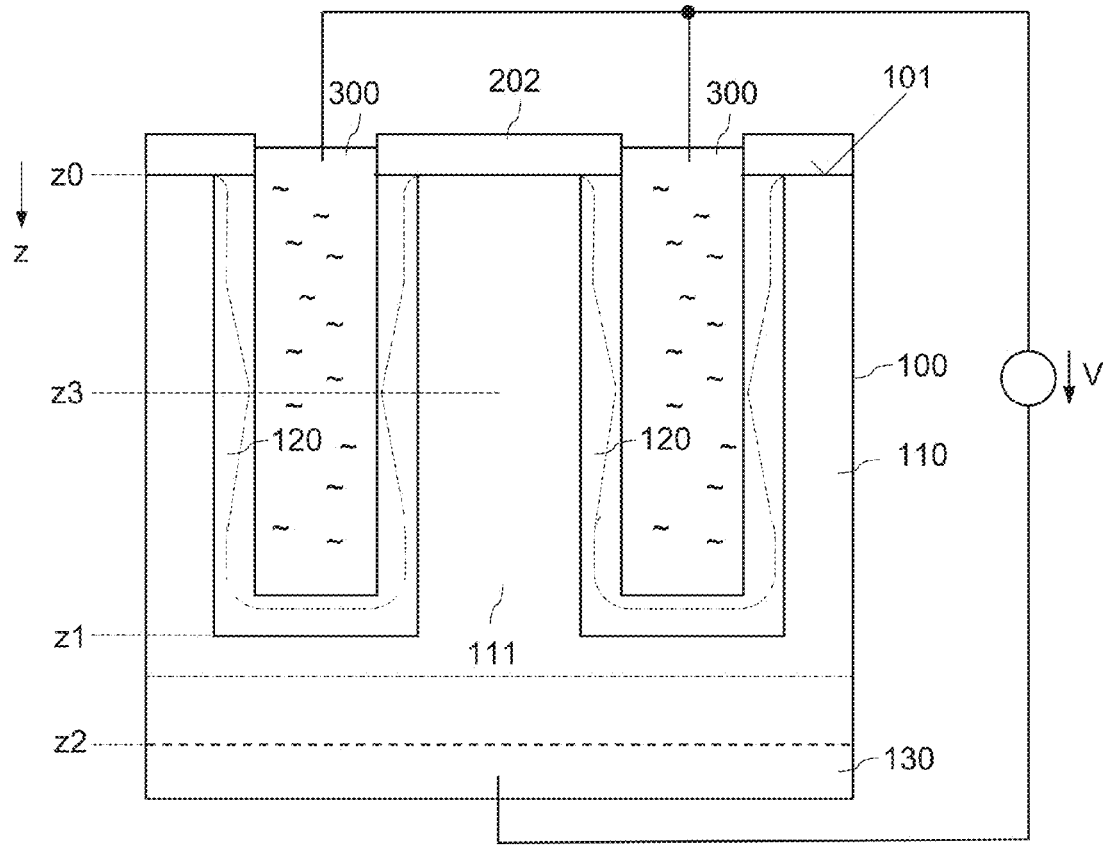
FIGS. 19A-19B illustrate one embodiment of a method for producing a drift region and a compensation region of a semiconductor device that includes a first semiconductor layer with a doping profile as shown in FIG. 18.

FIG. 19A shows a semiconductor body 100 that includes a first semiconductor layer 110 having a doping profile as shown in FIG. 18 during the etching process, that is after forming the at least one trench, and after forming the second semiconductor layer 120 on sidewalls and a bottom of the at least one trench. In this etching process, the voltage V is selected such that the mesa region 111 is completely depleted of charge carriers in the etching process. This causes the space charge region in the second semiconductor layer 120 to have a varying width, wherein the variation of the width of the space charge region in the second semiconductor layer 120 in the vertical direction z substantially corresponds to the variation of the doping concentration of the mesa region 111 in this vertical direction z. That is, the space charge region has a maximum width at the vertical position z3, where the mesa region 103 has the maximum doping concentration.

Consequently, after the etching process, the second semiconductor layer 120 has a maximum thickness at vertical position z3. This is illustrated in FIG. 19B, that shows the semiconductor body 100 after the etching process, and in FIG. 20, that shows the thickness $d_{120}$ of the second semiconductor layer 120 over the vertical position z.

Figure 19B:
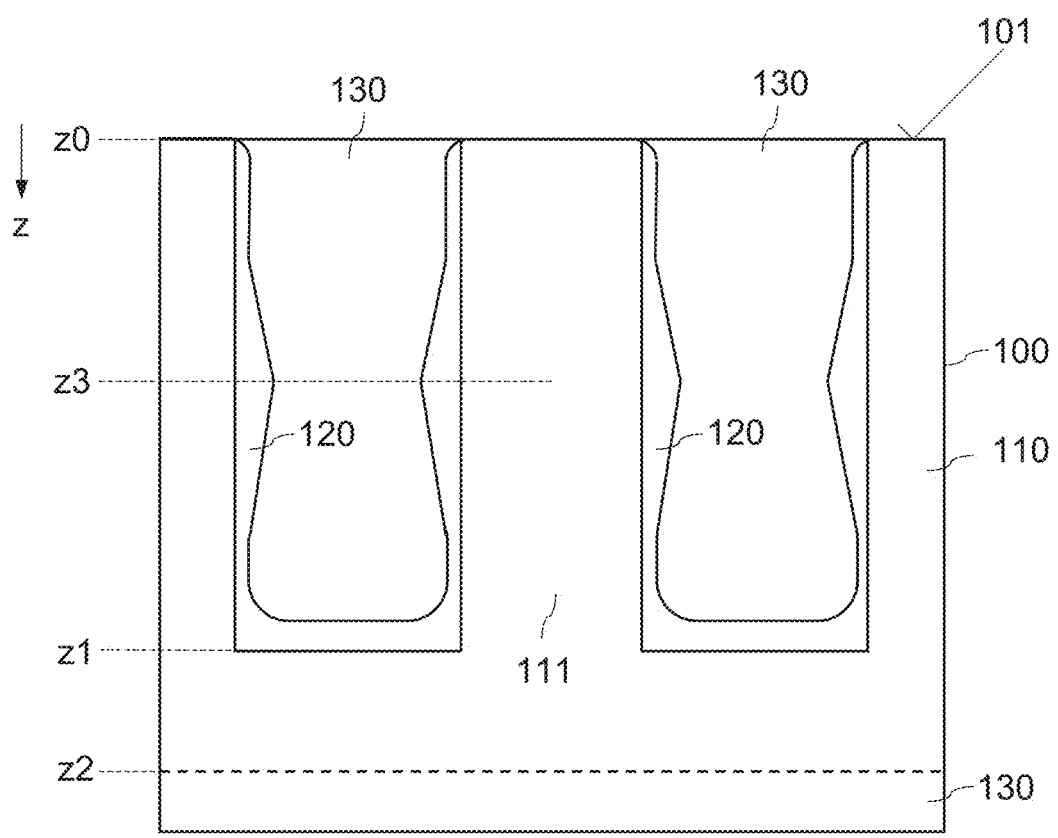
Figure 20:
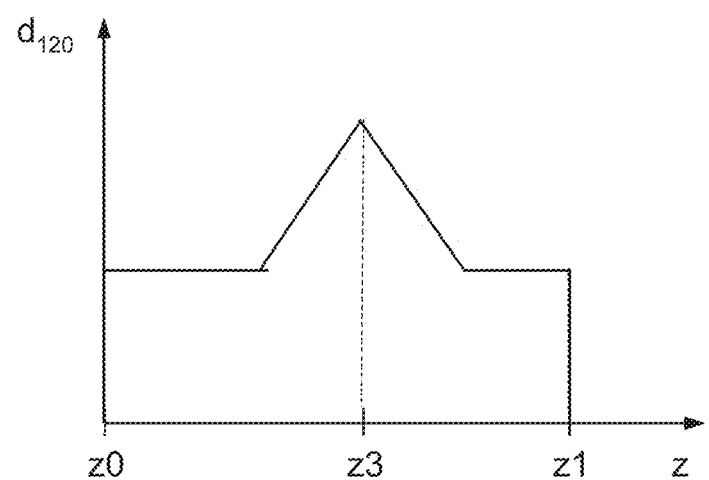
FIG. 20 illustrates a width of a second semiconductor layer produced in the method as shown in FIGS. 19A-19B.
Figure 21:
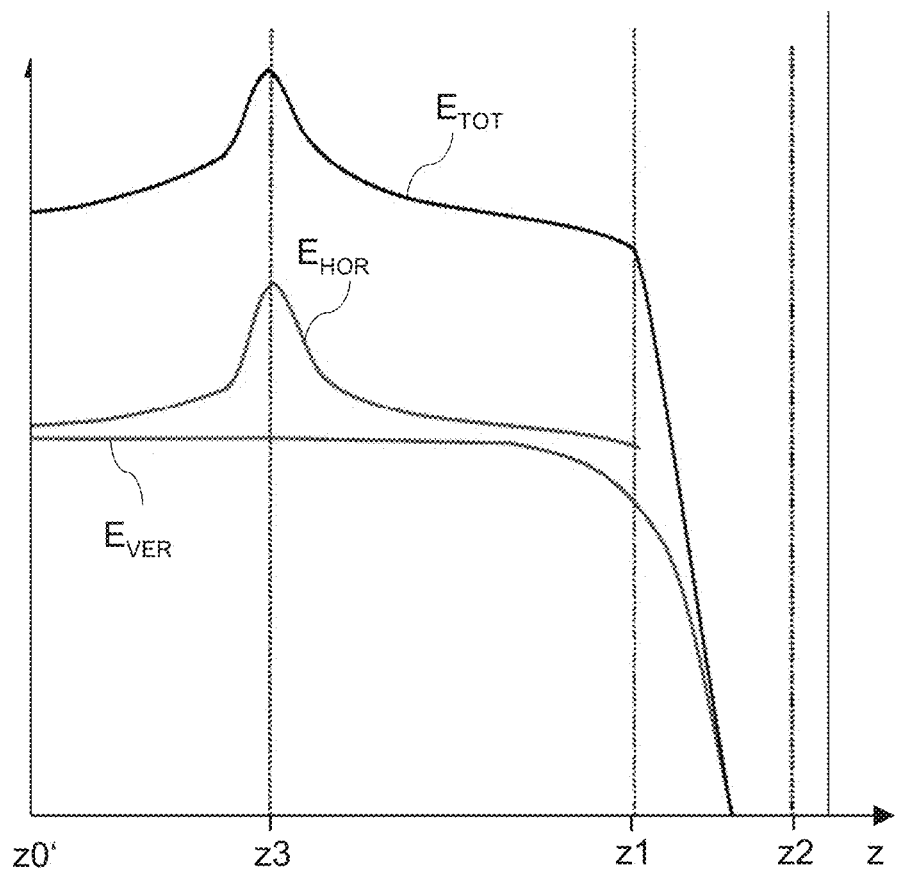
FIG. 21 illustrates the electric field in the mesa region of a semiconductor device that includes a first semiconductor layer with a doping profile as illustrated in FIG. 18.

FIG. 21 shows the horizontal electrical field, the vertical electrical field and the overall electrical field in a semiconductor device, such as a MOSFET as illustrated in FIG. 9, or a diode as illustrated in FIG. 12, when implemented with the semiconductor topology shown in FIG. 19B that includes a second semiconductor layer 120 as a compensation region 12 and a first semiconductor layer 110 as a drift region 11. FIG. 21 shows the electrical fields in the reverse biased state (off-state) of the semiconductor device.

Referring to FIG. 21, the vertical electrical field is substantially constant between a lower end of the body region (z0', which in case of a diode corresponds to a lower end of the second emitter region 42), and the bottom of the trench (z1). The horizontal electrical field has a maximum at the vertical position z3, where the mesa region 111 has a maximum of the doping concentration. Like in the embodiments explained hereinbefore, the maximum of the overall electrical field is at the vertical position z3, which is between the lower end of the body region and the bottom of the at least one trench, and within the mesa region 111.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

The invention claimed is:

1. A method of forming a superjunction device, comprising:
    forming at least one trench in a first surface of a first semiconductor layer of a first doping type, and a semiconductor mesa region adjoining the at least one trench;
    forming a second semiconductor layer at least on sidewalls and a bottom of the at least one trench; and
    etching the second semiconductor layer by filling the at least one trench with an etchant, and applying a voltage between the first semiconductor layer and the etchant such that a space charge region expands in the second semiconductor layer and in the first semiconductor layer;
    wherein the voltage is adjusted such that there is a first region in the semiconductor mesa region that is free of the space charge region when the voltage is applied.

2. The method of claim 1, wherein the semiconductor mesa region comprises a doping concentration that varies in a first direction perpendicular to the first surface.

3. The method of claim 2, wherein the semiconductor mesa region includes at least one section where a doping concentration increases towards a bottom of the at least one trench.

4. The method of claim 1, wherein the at least one trench is formed with tapered sidewalls.

5. The method of claim 4, wherein an angle between the first surface and the sidewalls of the at least one trench is between 95° and 115°.

6. The method of claim 5, wherein the semiconductor mesa region comprises a doping concentration that is substantially homogeneous.

7. The method of claim 1, wherein the first region extends from a first position of the mesa region in a direction away from the first surface.

8. The method of claim 7, wherein the first position is spaced apart from the first surface between 40% and 60% of a depth of the at least two trenches.

9. The method of claim 1, wherein the voltage is further selected such that there is a second region in the mesa region between the first region and the first surface that is completely depleted of charge carriers when the voltage is applied.

10. The method of claim 1, wherein the second semiconductor layer comprises a substantially homogeneous doping concentration.

11. The method of claim 1, wherein the etchant comprises at least one of KOH, and TMAH.

12. The method of claim 1, further comprising:
    after etching the second semiconductor layer, removing the second semiconductor layer from a bottom of a residual trench remaining after forming the second semiconductor layer in the at least one trench, and after the etching; and
    filling the residual trench with a filling material.

13. The method of claim 12, wherein the filling material is selected from a group consisting of:
    a monocrystalline intrinsic semiconductor material; and
    a monocrystalline semiconductor material of the first doping type.

14. The method of claim 1, further comprising:
forming the at least one trench to be ring-shaped, so that the at least one trench surrounds the semiconductor mesa region.

15. The method of claim 1, further comprising:
forming at least two spaced apart trenches, wherein the semiconductor mesa region is located between the at least two trenches.

16. The method of claim 1, wherein forming the second semiconductor layer comprises forming an epitaxial layer of a second doping type that is opposite the first doping type at least on the sidewalls and the bottom of the at least one trench.

17. The method of claim 1, wherein forming the second semiconductor layer comprises introducing dopant atoms of a second doping type that is opposite the first doping type at least into the bottom and the sidewalls of the at least one trench.

18. The method of claim 17, wherein the dopant atoms of the second doping type are introduced from a gaseous dopant source.

19. A method of forming a superjunction device, comprising:
forming at least one trench in a first surface of a first semiconductor layer of a first doping type, and a semiconductor mesa region adjoining the at least one trench in the first semiconductor layer, wherein the semiconductor mesa region has a doping maximum at a first position between the first surface and a position corresponding to a position of a bottom of the at least one trench;
forming a second semiconductor layer at least on sidewalls and a bottom of the at least one trench; and
etching the second semiconductor layer by filling the at least one trench with an etchant, and by applying a voltage between the first semiconductor layer and the etchant such that a space charge region expands in the second semiconductor layer and in the first semiconductor layer;
wherein the voltage is adjusted such that the space charge region completely covers the semiconductor mesa region.

20. The method of claim 19, wherein the first position is spaced apart from the first surface between 40% and 60% of a depth of the at least two trenches.

* * * * *